(12) United States Patent
Kim et al.

(10) Patent No.: US 10,643,888 B2
(45) Date of Patent: *May 5, 2020

(54) OVERLAY MARKS, METHODS OF FORMING THE SAME, AND METHODS OF FABRICATING SEMICONDUCTOR DEVICES USING THE SAME

(71) Applicant: Samsung Electronics Co., Ltd., Suwon-si, Gyeonggi-do (KR)

(72) Inventors: Jong-Su Kim, Seoul (KR);
Dong-Woon Park, Seoul (KR);
Tae-Hoi Park, Hwaseong-si (KR);
Yong-Kug Bae, Hwaseong-si (KR);
Tae-Hwan Oh, Goyang-si (KR);
Chang-Hoon Lee, Yongin-si (KR);
Boo-Hyun Ham, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 277 days.

This patent is subject to a terminal disclaimer.

(21) Appl. No.: 15/621,618

(22) Filed: Jun. 13, 2017

(65) Prior Publication Data

US 2017/0278745 A1 Sep. 28, 2017

Related U.S. Application Data

(63) Continuation of application No. 14/810,621, filed on Jul. 28, 2015, now Pat. No. 9,711,395.

(30) Foreign Application Priority Data

Jul. 30, 2014 (KR) .................. 10-2014-0097588

(51) Int. Cl.
*H01L 21/768* (2006.01)
*H01L 21/8234* (2006.01)
(Continued)

(52) U.S. Cl.
CPC .... *H01L 21/76816* (2013.01); *G03F 7/70633* (2013.01); *G03F 7/70683* (2013.01);
(Continued)

(58) Field of Classification Search
None
See application file for complete search history.

(56) References Cited

U.S. PATENT DOCUMENTS

| 5,889,335 A | 3/1999 | Kuroi et al. |
| 6,628,001 B1 | 9/2003 | Chittipeddi et al. |

(Continued)

FOREIGN PATENT DOCUMENTS

| JP | 2010-153697 | 7/2010 |
| KR | 1020080032615 | 4/2008 |

*Primary Examiner* — Nilufa Rahim
(74) *Attorney, Agent, or Firm* — Myers Bigel, P.A.

(57) ABSTRACT

In a method of fabricating a semiconductor device, a substrate including a circuit area and an overlay mark area is provided. Conductive gate patterns are formed on the substrate in the circuit area such that the overlay mark area is free of the gate patterns, and conductive contact patterns are formed on the substrate between the gate patterns in the circuit area. A mirror pattern is formed on the substrate in the overlay mark area, where the mirror pattern and the contact patterns comprising a same reflective material. Related semiconductor devices, overlay marks, and fabrication methods are also discussed.

20 Claims, 35 Drawing Sheets

(51) Int. Cl.
    *H01L 21/311*    (2006.01)
    *G03F 7/20*    (2006.01)
    *H01L 27/02*    (2006.01)
    *H01L 21/285*    (2006.01)

(52) U.S. Cl.
    CPC .. *H01L 21/31144* (2013.01); *H01L 21/76811* (2013.01); *H01L 21/76897* (2013.01); *H01L 21/823437* (2013.01); *H01L 21/823475* (2013.01); *H01L 27/0207* (2013.01); *H01L 21/28518* (2013.01)

(56) References Cited

U.S. PATENT DOCUMENTS

| | | |
|---|---|---|
| 7,550,379 B2 | 6/2009 | Van Haren et al. |
| 2003/0127751 A1 | 7/2003 | Yamada et al. |
| 2009/0146325 A1 | 6/2009 | Liu et al. |
| 2013/0009328 A1 | 1/2013 | Wang et al. |
| 2014/0206111 A1 | 7/2014 | Tanaka |
| 2014/0291858 A1 | 10/2014 | Bouton et al. |
| 2014/0363984 A1* | 12/2014 | Fukuda ............... H01L 21/0274 438/778 |
| 2015/0021732 A1 | 1/2015 | Kanai et al. |

\* cited by examiner

30

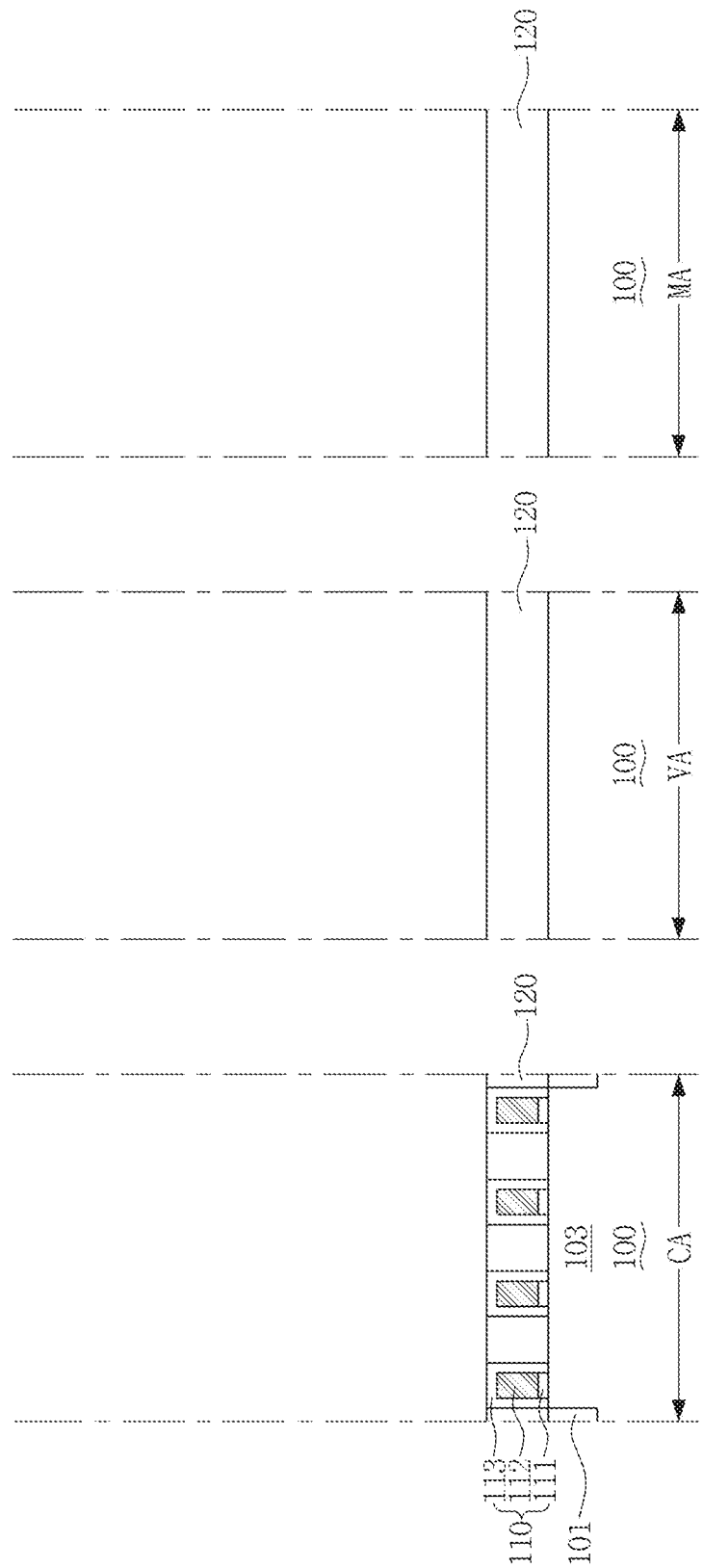

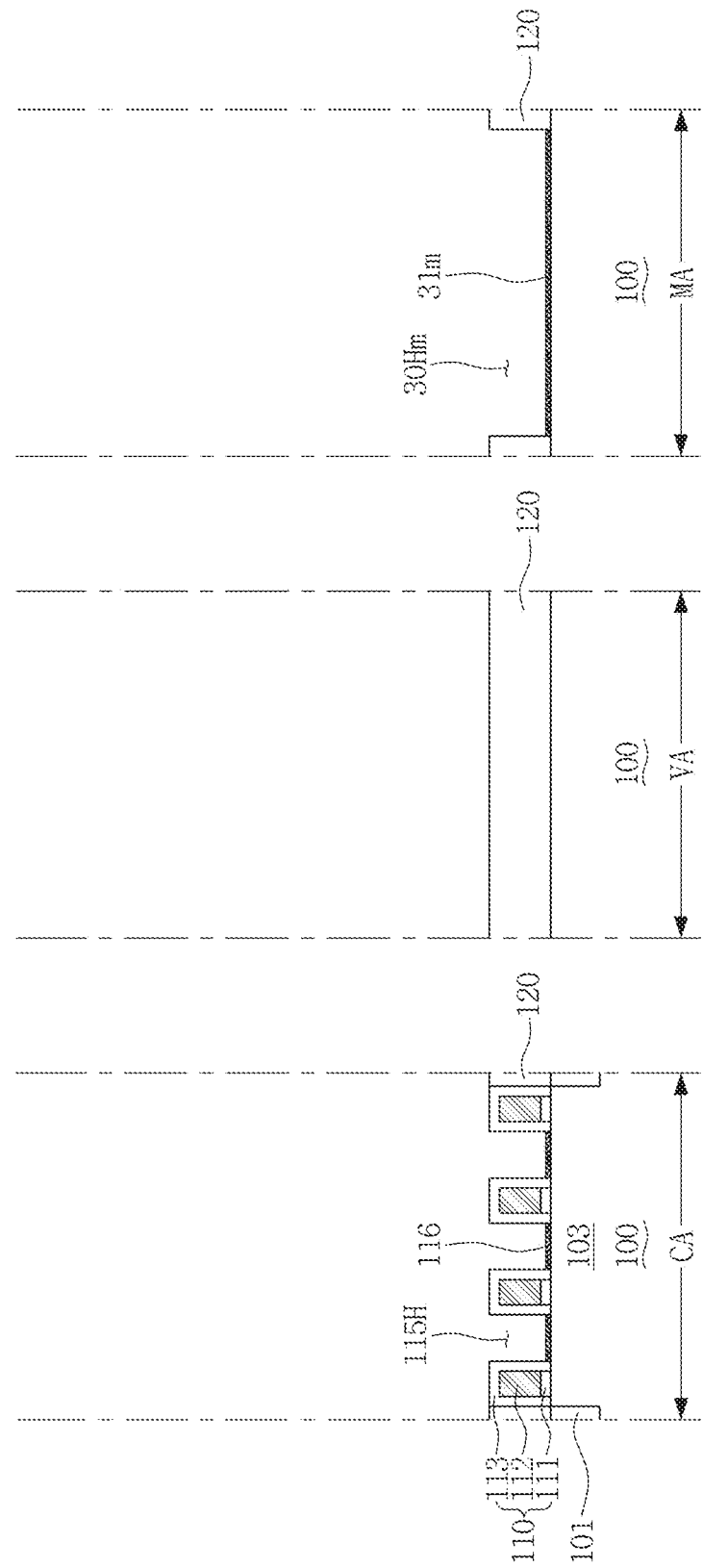

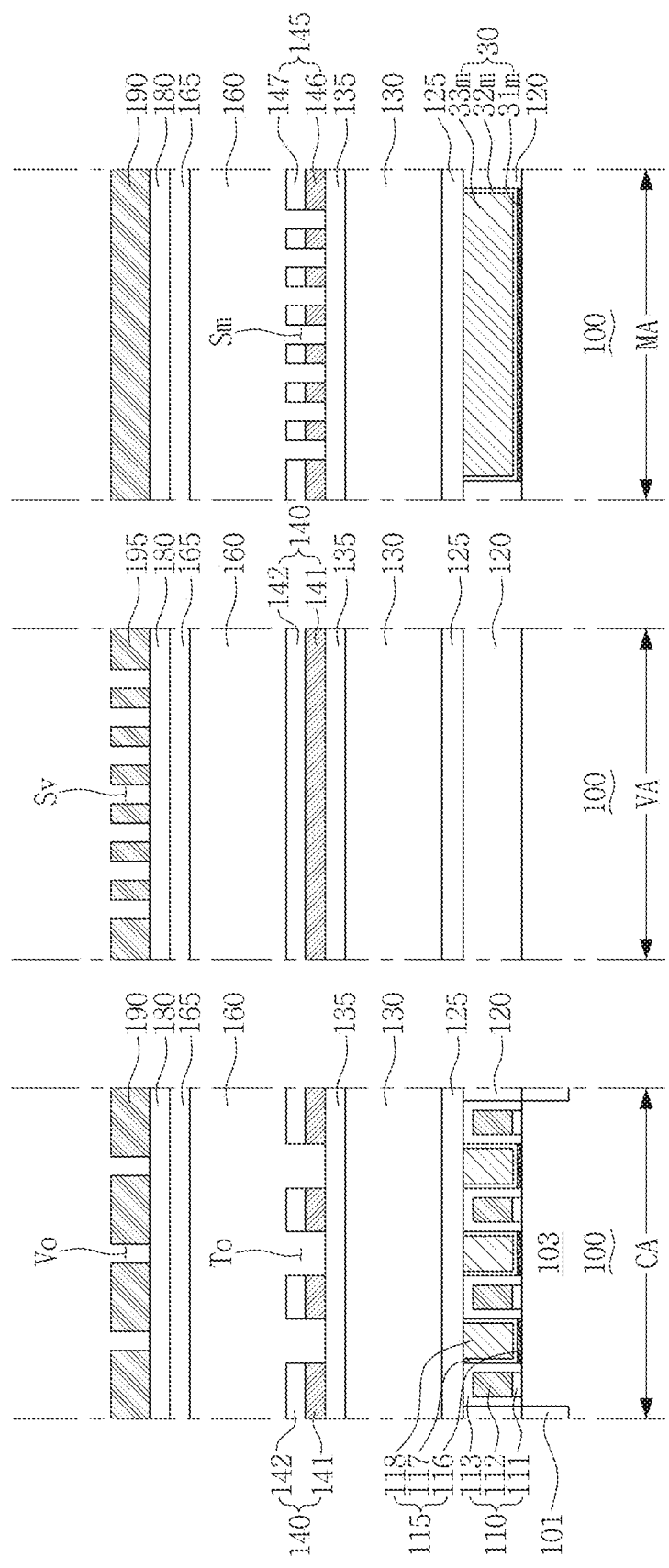

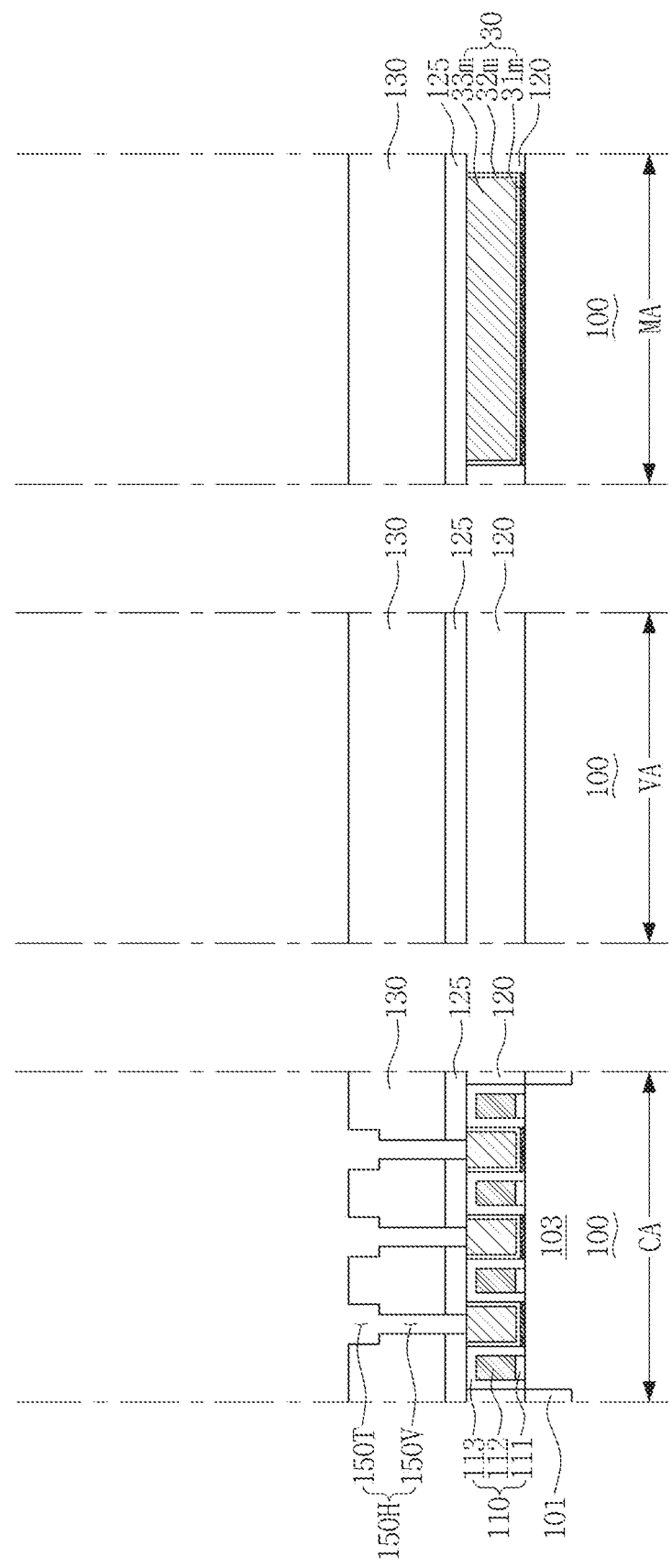

OVERLAY MARKS, METHODS OF FORMING THE SAME, AND METHODS OF FABRICATING SEMICONDUCTOR DEVICES USING THE SAME

CROSS-REFERENCE TO RELATED APPLICATION

The present application is a continuation application of and claims priority from U.S. patent application Ser. No. 14/810,621, filed on Jul. 28, 2015, and claims priority under 35 U.S.C. § 119 to Korean Patent Application No. 10-2014-0097588 filed on Jul. 30, 2014, the disclosure of which is hereby incorporated by reference in its entirety.

BACKGROUND

Field

Embodiments of the inventive concepts relate to overlay marks used in semiconductor device fabrication, methods of forming the same, and methods of fabricating semiconductor devices using the same.

Description of Related Art

Processes of fabricating semiconductor devices have become more elaborate due to an increasing degree of integration of semiconductor devices. Therefore, an alignment process performed before a photolithography process and an overlay inspection process performed after the photolithography process may both require increased precision. The overlay inspection process is a process that inspects whether a pattern disposed at a lower level and a pattern disposed at a higher level are formed to be appropriately aligned. The overlay inspection process may become more difficult as a stack height of the semiconductor device is gradually increased. For example, it may be difficult to distinguish an overlay mark formed at a lower level because of the height of the highly stacked materials.

SUMMARY

Embodiments of the inventive concepts provide an overlay mark.

Other embodiments of the inventive concepts provide semiconductor devices having an overlay mark.

Other embodiments of the inventive concepts provide methods of forming an overlay mark.

Other embodiments of the inventive concepts provide methods of forming an interconnection-via structure using an overlay mark.

Other embodiments of the inventive concepts provide methods of fabricating a semiconductor device using an overlay mark.

The technical objectives of the inventive concepts are not limited to the above disclosure; other objectives may become apparent to those of ordinary skill in the art based on the following descriptions.

According to some embodiments of the inventive concepts, a semiconductor device includes a substrate including a circuit area and an overlay mark area, conductive gate patterns and conductive contact patterns therebetween on the substrate in the circuit area, and a mirror pattern on the substrate in the overlay mark area. The overlay mark area is free of the gate patterns. The mirror pattern and the contact patterns include a same reflective material.

In some embodiments, the mirror pattern and the contact patterns may be portions of a same layer of the reflective material. A surface of the mirror pattern may be coplanar with respective surfaces of the contact patterns.

In some embodiments, the mirror pattern and the contact patterns may respectively include a silicide layer, a metal barrier layer, and a metal plate layer including one of the portions of the layer of the reflective material.

In some embodiments, the overlay mark area may include a main rule area having the mirror pattern thereon and a vernier rule area that is free of the mirror pattern.

In some embodiments, an insulating layer may be provided on the gate patterns, the contact patterns therebetween, and the mirror pattern. Conductive via patterns may extend through respective via holes in the insulating layer that are aligned with the contact patterns in the circuit area. The conductive via patterns may provide electrical connections to the contact patterns.

In some embodiments, the conductive via patterns may be first conductive via patterns, and second conductive via patterns may extend through respective via holes in the insulating layer that are aligned with the gate patterns in the circuit area. The second conductive via patterns may provide electrical connections to the gate patterns.

In some embodiments, the gate patterns may extend in a direction that is substantially perpendicular to a direction in which the mirror pattern extends.

In some embodiments, an overlay mark on the substrate in the overlay mark area may include the mirror pattern, a main pattern, and a vernier pattern on respective different levels. The main pattern may include a plurality of elongated slits extending therethrough, and may overlap the mirror pattern in plan view.

In some embodiments, the overlay mark area may include a main rule area including the mirror pattern and the main pattern stacked thereon, and a vernier rule area including the vernier pattern thereon. The vernier pattern may include a plurality of elongated slits extending therethrough, and may not overlap the main pattern in plan view.

According to further embodiments of the inventive concepts, in a method of fabricating a semiconductor device, a substrate including a circuit area and an overlay mark area is provided. Conductive gate patterns are formed on the substrate in the circuit area such that the overlay mark area is free of the gate patterns, and conductive contact patterns are formed on the substrate between the gate patterns in the circuit area. A mirror pattern is formed on the substrate in the overlay mark area. The mirror pattern and the contact patterns include a same reflective material.

In some embodiments, forming the contact patterns and forming the mirror pattern may include forming a layer of the reflective material on the substrate between the gate patterns in the circuit area and in a trench in the overlay mark area, and planarizing the layer of the reflective material such that the mirror pattern and the contact patterns comprise portions thereof. A surface of the mirror pattern may be coplanar with respective surfaces of the contact patterns.

In some embodiments, an insulating layer may be formed on the gate patterns, the contact patterns therebetween, and the mirror pattern. Respective via holes may be formed in the insulating layer and aligned with the contact patterns in the circuit area. Conductive via patterns may be formed extending through the respective via holes in the insulating layer to provide electrical connections to the contact patterns.

In some embodiments, in forming the respective via holes, a trench mask may be formed on the insulating layer. The trench mask may include respective trench openings therein in the circuit area that are aligned with the contact patterns, and respective main slits extending therethrough in the main rule area and defining a main pattern. The main pattern may overlap the mirror pattern in plan view. A via mask may be formed on the trench mask. The via mask may include respective via openings therein in the circuit area that are aligned with ones of the trench openings, and respective vernier slits extending therethrough in the vernier rule area and defining a vernier pattern. The vernier pattern may not overlap the main pattern in plan view.

In some embodiments, in forming the respective via holes, first via holes may be formed aligned with the contact patterns, and second via holes may be formed aligned with the gate patterns in the circuit area. In the conductive via patterns, first conductive via patterns may be formed extending through the first via holes to provide electrical connections to the contact patterns, and second via patterns may be formed extending through the second via holes to provide electrical connections to the gate patterns.

In some embodiments, a main pattern may be formed on the mirror pattern in the overlay mark area. The main pattern may include a plurality of elongated main slits extending therethrough, and may overlap the mirror pattern in plan view. A vernier pattern may be formed in the overlay mark area at a different level than the main pattern. The vernier pattern may include a plurality of elongated vernier slits extending therethrough.

In some embodiments, the overlay mark area may include a main rule area including the mirror pattern and the main pattern stacked thereon, and a vernier rule area including the vernier pattern thereon. The vernier pattern may not overlap the main pattern in plan view. In some embodiments, the vernier pattern may overlap the mirror pattern in plan view.

In accordance with an aspect of the inventive concepts, a method of fabricating a semiconductor device using an overlay mark includes preparing a substrate having a circuit area, a vernier rule area, and a main rule area, forming gate patterns in the circuit area of the substrate, forming a lower interlayer insulating layer on the substrate to surround the gate patterns, forming a contact pattern between the gate patterns in the circuit area and a mirror pattern in the lower interlayer insulating layer in the main rule area, forming a lower stopping insulating layer on the gate patterns, the contact pattern, the mirror pattern, and the lower interlayer insulating layer, forming an upper interlayer insulating layer on the lower stopping insulating layer, forming a trench mask on the upper interlayer insulating layer, forming a sacrificial layer on the trench mask, and forming a via mask on the sacrificial layer.

In accordance with another aspect of the inventive concepts, a method of forming an overlay mark may include forming a lower interlayer insulating layer on a substrate, forming a mirror pattern in the lower interlayer insulating layer, forming an upper interlayer insulating layer on the lower interlayer insulating layer and the mirror pattern, forming a main pattern, which is vertically aligned with and overlaps the mirror pattern, on the upper interlayer insulating layer, forming a sacrificial layer on the main pattern, and forming a vernier pattern on the sacrificial layer.

In accordance with still another aspect of the inventive concepts, a method of fabricating a semiconductor device using an overlay mark may include preparing a substrate having a circuit area, a vernier rule area, and a main rule area, forming gate patterns in the circuit area of the substrate, forming a lower interlayer insulating layer on the substrate to surround the gate patterns, forming contact patterns between the gate patterns in the circuit area and a mirror pattern in the lower interlayer insulating layer in the main rule area, forming an upper interlayer insulating layer on the gate patterns, the contact patterns, the mirror pattern, and the lower interlayer insulating layer, forming a trench mask on the upper interlayer insulating layer, wherein the trench mask includes trench openings vertically aligned with the contact patterns in the circuit area and a main pattern in the main rule area, forming a lower sacrificial layer on the trench mask, forming an intermediate mask layer on the lower sacrificial layer, forming a first upper sacrificial layer on the intermediate mask layer, forming a first via mask on the first upper sacrificial layer, wherein the first via mask includes a first via opening in the circuit area and a first vernier pattern in the vernier rule area, selectively etching the first upper sacrificial layer and the intermediate mask layer using the first via mask as an etch mask and forming a preliminary intermediate mask pattern having a first intermediate via hole, removing the first upper sacrificial layer and the first via mask, forming a second upper sacrificial layer on the preliminary intermediate mask pattern, forming a second via mask on the second upper sacrificial layer, wherein the second via mask includes a second via opening in the circuit area and a second vernier pattern in the vernier rule area, selectively etching the second upper sacrificial layer and the preliminary intermediate mask pattern using the second via mask as an etch mask and forming an intermediate mask pattern having the first intermediate via hole and a second intermediate via hole, etching the lower sacrificial layer, the trench mask, and the upper interlayer insulating layer using the intermediate mask pattern as an etch mask and forming an interconnection-via hole in the upper interlayer insulating layer, and forming an interconnection-via pattern to fill the interconnection-via hole.

In accordance with yet another aspect of the inventive concepts, an overlay mark may include four pairs of main patterns, vernier patterns, and mirror patterns disposed in a square-shaped area, wherein the each vernier pattern may include vernier slits disposed on an inside of the square-shaped area and toward the inside of the square-shaped area, the each main pattern may include main slits disposed on an outside of the square-shaped area and toward the outside of the square-shaped area, and the mirror patterns may overlap the main patterns, respectively.

In accordance with yet another aspect of the inventive concepts, a semiconductor device may include gate patterns disposed in a circuit area of a substrate, contact patterns disposed between the gate patterns, and a mirror pattern disposed in a main rule area of the substrate, wherein the mirror pattern may include a mirror silicide layer disposed on the substrate, a mirror barrier layer disposed on the mirror silicide layer, and a mirror plate on the mirror barrier layer.

Details of other embodiments are included in detailed explanations and the drawings.

BRIEF DESCRIPTION OF THE DRAWINGS

The foregoing and other features and advantages of the inventive concepts will be apparent from the more particular description of preferred embodiments of the inventive concepts, as illustrated in the accompanying drawings in which like reference characters refer to the same parts throughout the different views. The drawings are not necessarily to scale, emphasis instead being placed upon illustrating the principles of the inventive concepts. In the drawings:

FIGS. 5A to 5I are views illustrating a method of forming interconnection-via patterns of a semiconductor device using an overlay mark in accordance with some embodiments of the inventive concepts. FIGS. 5A to 5I each are longitudinal or cross-sectional views taken along lines IV-IV' shown in FIG. 4, and I-I', and II-II' shown in FIG. 1A.

DETAILED DESCRIPTION OF THE EMBODIMENTS

Figure 1A:
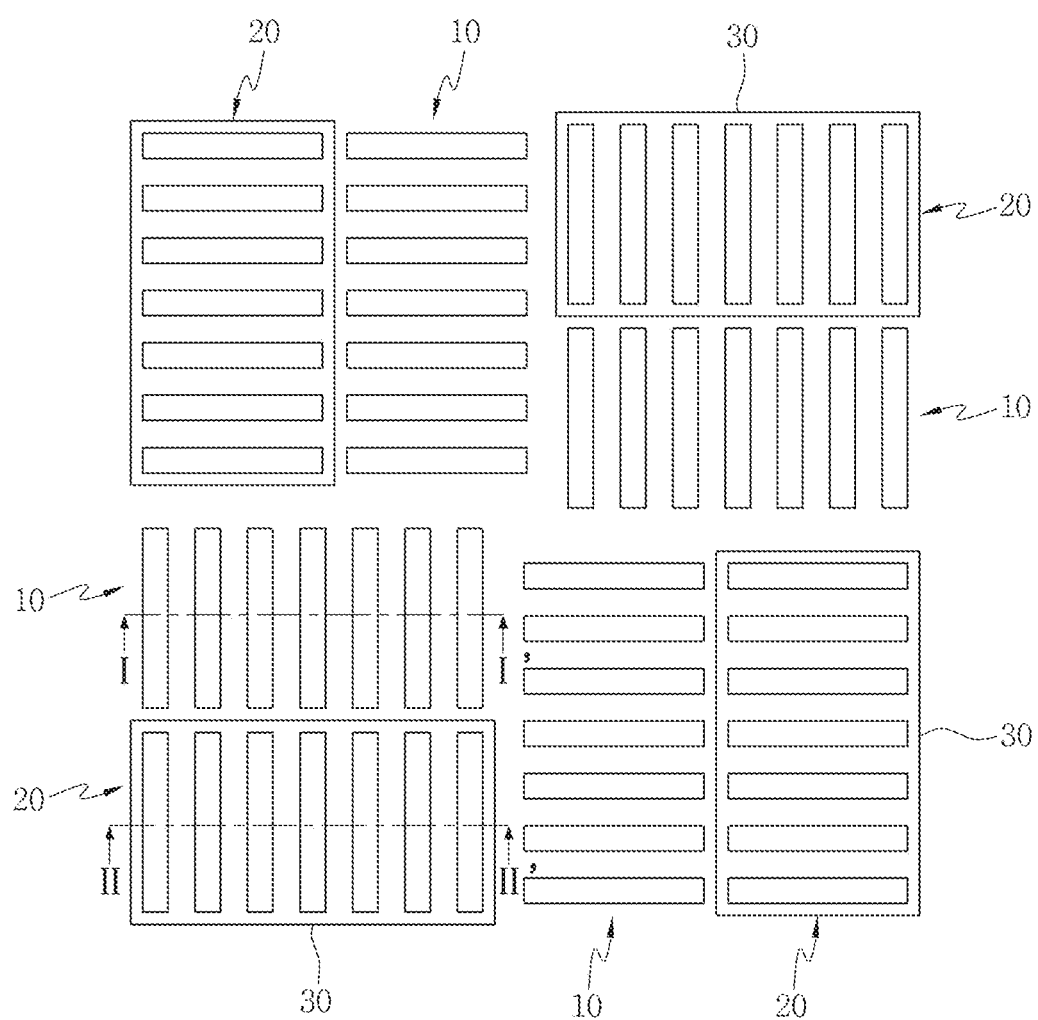
FIG. 1A is a layout or plan view of an overlay mark in accordance with some embodiments of the inventive concepts.

Various embodiments will now be described more fully with reference to the accompanying drawings in which some embodiments are shown. These inventive concepts may, however, be embodied in different forms and should not be construed as limited to the embodiments set forth herein. Rather, these embodiments are provided so that this disclosure is thorough and complete and fully conveys the inventive concepts to those skilled in the art.

The terminology used herein is for the purpose of describing particular embodiments only and is not intended to be limiting of the present inventive concepts. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on," "connected to," or "coupled to" another element or layer, it can be directly on, connected, or coupled to the other element or layer or intervening elements or layers may be present. In contrast, when an element is referred to as being "directly on," "directly connected to," or "directly coupled to" another element or layer, there are no intervening elements or layers present. As used herein, the term "and/or" includes any and all combinations of one or more of the associated listed items.

Spatially relative terms, such as "beneath," "below," "lower," "above," "upper," and the like, may be used herein for ease of description in describing one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

The exemplary embodiments of the inventive concepts will be described with reference to cross-sectional views and/or plan views, which are ideal exemplary views. Thicknesses of layers and areas are exaggerated for effective description of the technical contents in the drawings. Forms of the embodiments may be modified by the fabricating technology and/or tolerances. Therefore, the embodiments of the inventive concepts are not intended to be limited to illustrated specific forms, and include modifications of forms generated according to fabricating processes. For example, an etching area illustrated at a right angle may be round or have a predetermined curvature. Therefore, areas illustrated in the drawings have overview properties, and shapes of the areas are illustrated special forms of the areas of a device, and are not intended to limit the scope of the inventive concepts.

Hereinafter, like reference numerals in the drawings denote like elements. Therefore, although like reference numerals or similar reference numerals may not be mentioned or described in a drawing, it will be described with reference to the other drawings. Further, although reference numerals are not illustrated, it will be described with reference to the other drawings.

Unless otherwise defined, all terms (including technical and scientific terms) used herein have the same meaning as commonly understood by one of ordinary skill in the art to which this invention belongs. Accordingly, these terms can include equivalent terms that are created after such time. It will be further understood that terms, such as those defined in commonly used dictionaries, should be interpreted as having a meaning that is consistent with their meaning in the present specification and in the context of the relevant art, and will not be interpreted in an idealized or overly formal sense unless expressly so defined herein. All publications, patent applications, patents, and other references mentioned herein are incorporated by reference in their entirety.

Figure 1B:
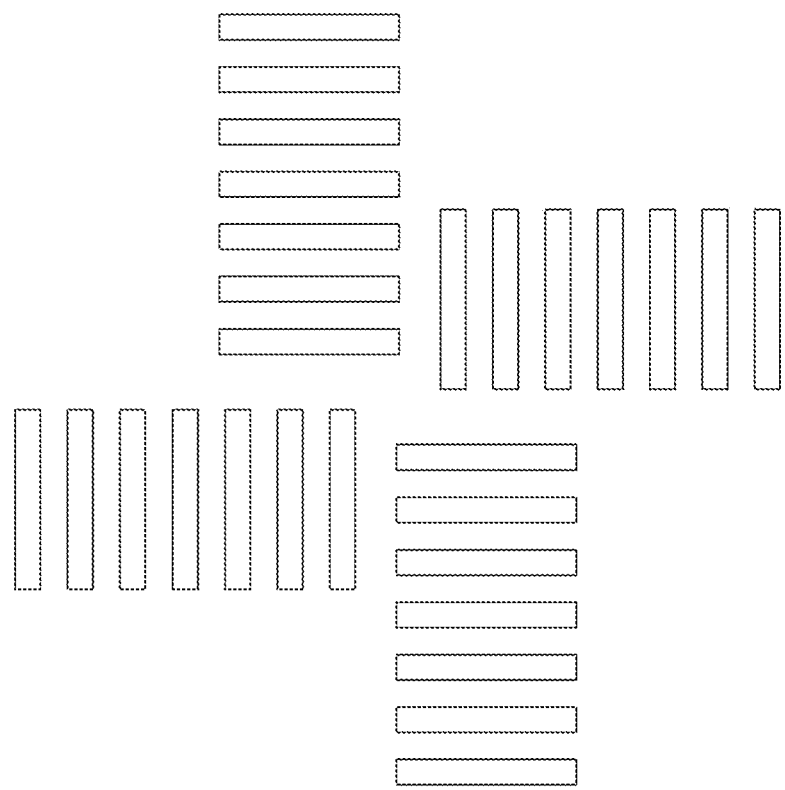
FIG. 1B is a layout or plan view of vernier patterns of the overlay mark.
Figure 1C:
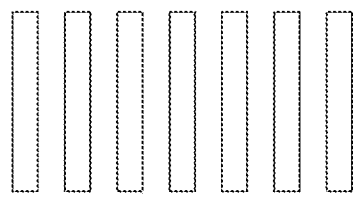
FIG. 1C is a layout of main patterns of the overlay mark.
Figure 1C:
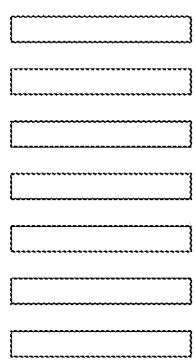
Figure 1C:
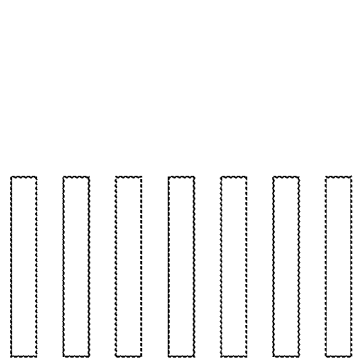
Figure 1C:
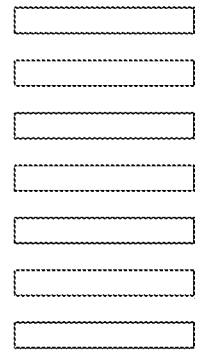
Figure 1D:
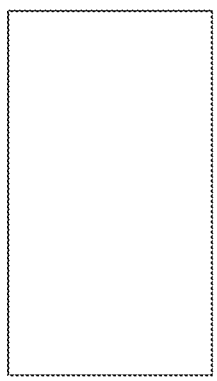
FIG. 1D is a layout of mirror patterns of the overlay mark.
Figure 1D:
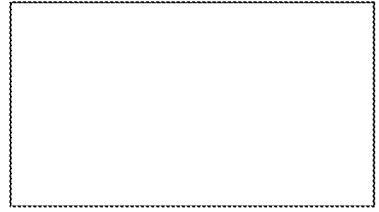
Figure 1D:
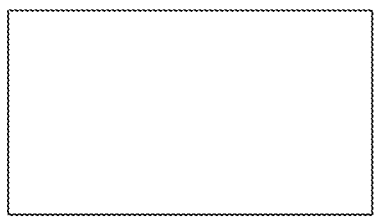
Figure 1D:

FIG. 1A is a layout of an overlay mark in accordance with some embodiments of the inventive concepts, FIG. 1B is a layout of vernier patterns 10 of the overlay mark, FIG. 1C is a layout of main patterns 20 of the overlay mark, and FIG. 1D is a layout of mirror patterns 30 of the overlay mark.

Referring to FIGS. 1A to 1D, the overlay mark arranged in four directions or quadrants in a square-shaped area may include the vernier patterns 10, the main patterns 20, and the mirror patterns 30.

The vernier patterns 10 and the main patterns 20 each may include a plurality of bars or slits, which are arranged vertically or horizontally in a pinwheel form, in each of four quadrants of the square-shaped area. The vernier patterns 10 may be arranged in an inner side in the square-shaped area or inner portion of each quadrant and the main patterns 20 may be arranged in an outer side in the square-shaped area or outer portion of each quadrant. The mirror patterns 30 may vertically overlap and/or be aligned with the main patterns 20 in plan view. For example, the main patterns 20 may vertically overlap to be arranged inside or within respective boundaries of the mirror patterns 30 in a top or plan view or a layout.

The vernier patterns 10 and the main patterns 20 may not vertically overlap, and may be arranged to be horizontally aligned so as not to overlap in a top or plan view or a layout. That is, the vernier patterns 10 and the main patterns 20 may appear to extend alongside one another in plan view. The vernier patterns 10 and the mirror patterns 30 may also not vertically overlap in a top or plan view or a layout. In other words, the vernier patterns 10 may be outside the respective boundaries of the mirror patterns 30 in plan view.

The vernier patterns 10 and the main patterns 20 are formed on layers having different levels, and may be used to determine a vertical alignment degree of each level in a semiconductor fabrication process. The mirror patterns 30 may be formed at a lower level than the main patterns 20, and thus contrast of the main patterns 20 may be improved.

FIGS. 2A to 2G each are longitudinal cross-sectional views taken along lines I-I' and II-II' shown in FIG. 1A for describing methods of forming an overlay mark in accordance with embodiments of the inventive concepts.

Figure 2A:
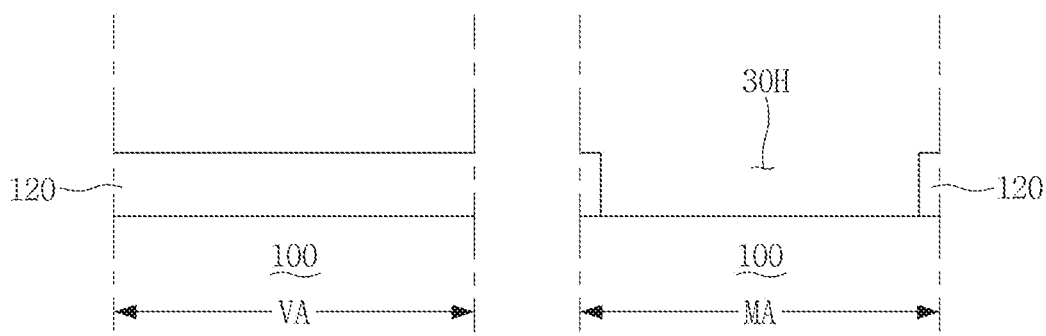
FIGS. 2A to 2G each are longitudinal or cross-sectional views taken along lines I-I' and II-II' shown in FIG. 1A, respectively, illustrating methods of forming an overlay mark in accordance with embodiments of the inventive concepts.

Referring to FIG. 2A, the methods of forming the overlay mark in accordance with embodiments of the inventive concepts may include preparing a substrate 100 having an overlay mark area including a vernier rule area VA and a main rule area MA, forming a lower interlayer insulating layer 120 on the substrate 100, and forming a hole or opening 30H of a square shape in the lower interlayer insulating layer 120 to expose a surface of the substrate 100 in the main rule area MA. The substrate 100 may include silicon (Si) or silicon oxide. For example, the substrate 100 may be or include a silicon wafer. The lower interlayer insulating layer 120 may include silicon oxide such as tetraethyl orthosilicate (TEOS) or a high density plasma (HDP)-oxide.

Figure 2B:
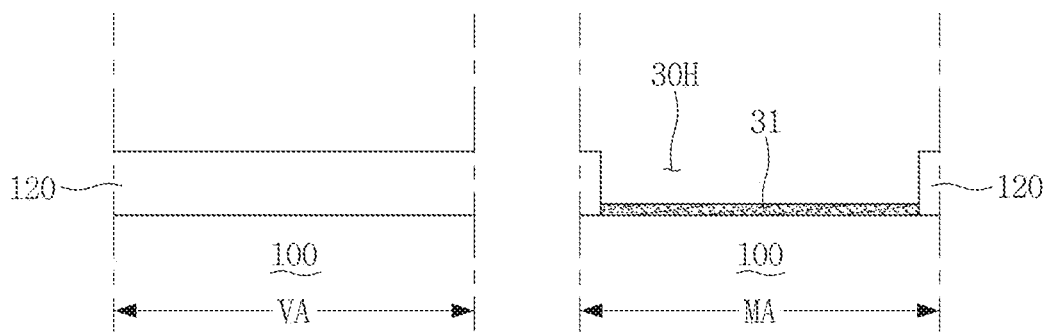

Referring to FIG. 2B, the method may include forming a silicide layer 31 on the surface of the exposed substrate 100. The silicide layer 31 may be formed by forming a metal layer including titanium (Ti), tungsten (W), nickel (Ni), or cobalt (Co) on the surface of the exposed substrate 100 and then performing a silicidation process. Therefore, the silicide layer 31 may include tungsten silicide (WSi), titanium silicide (TiSi), nickel silicide (NiSi), cobalt silicide (CoSi), or another metal silicide. The silicide layer 31 may directly contact the surface of the substrate 100.

Figure 2C:
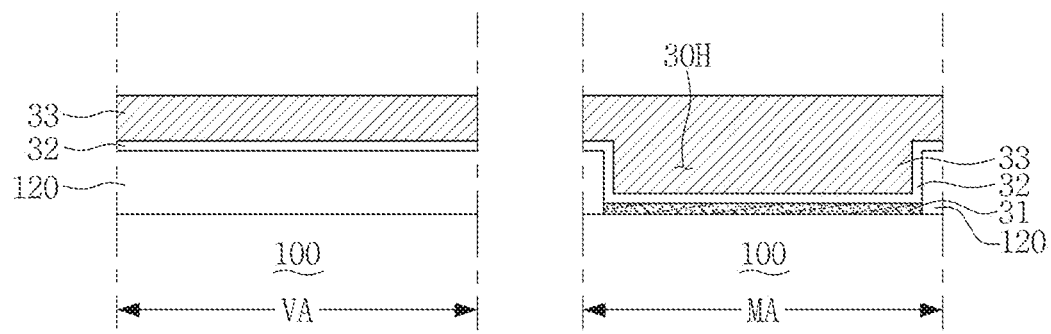

Referring to FIG. 2C, the method may include forming a barrier layer 32 on an upper surface of the silicide layer 31 and an inside wall of the hole 30H and forming a plate 33 on the barrier layer 32 to fill the hole 30H. The barrier layer 32 may include titanium nitride (TiN). The plate 33 may include a metal such as tungsten (W) or copper (Cu).

Figure 2D:
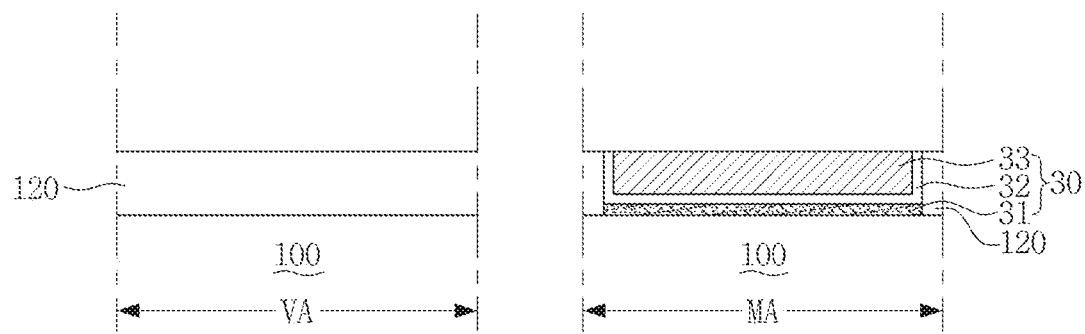

Referring to FIG. 2D, the method may include forming a mirror pattern 30 including the silicide layer 31, the barrier layer 32, and the plate 33 by performing a planarization process such as a chemical mechanical polishing (CMP) process. An upper surface of the mirror pattern 30 and an upper surface of the lower interlayer insulating layer 120 may be coplanar.

Figure 2E:
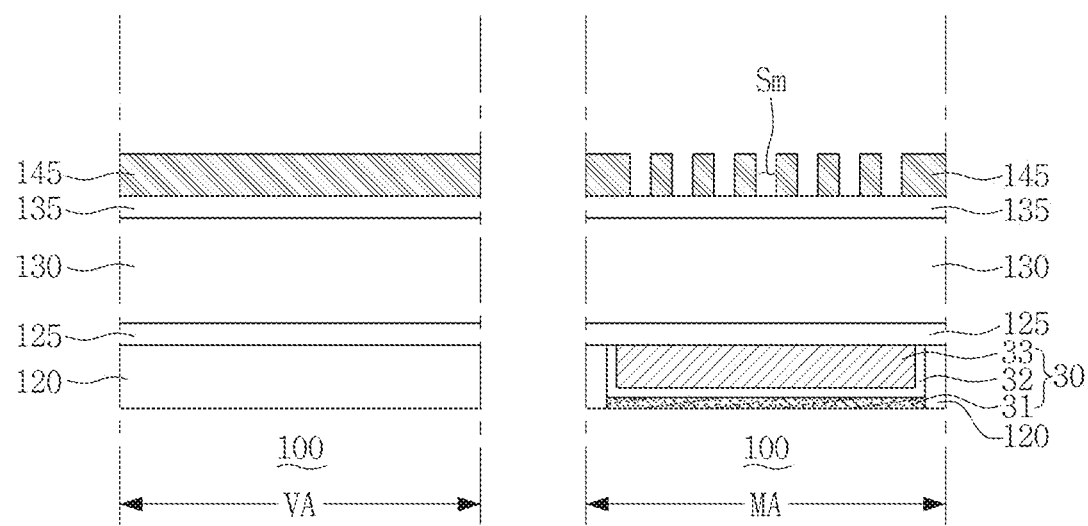

Referring to FIG. 2E the method may include forming a lower stopping insulating layer 125, an upper interlayer insulating layer 130, an upper stopping insulating layer 135, and a main pattern 145 on the mirror pattern 30 and the lower interlayer insulating layer 120. The main pattern 145 may include a plurality of parallel main slits Sm that selectively expose an upper surface of the upper stopping insulating layer 135 in the main rule area MA. The main pattern 145 may not have any patterns in the vernier rule area VA. In other words, the slits Sm defining the main pattern 145 may not be present in the vernier rule area VA.

The lower stopping insulating layer 125 may include a material harder than the lower interlayer insulating layer 120, for example, silicon nitride (SiN), silicon carbide nitride (SiCN), and/or silicon oxynitride (SiON). The upper interlayer insulating layer 130 may include an insulating material whose permittivity is lower than that of silicon dioxide ($SiO_2$), such as octamethylcyclotetrasilane (OM-CTS). The upper stopping insulating layer 135 may include a material harder than the upper interlayer insulating layer 130, for example, silicon nitride (SiN), silicon carbide nitride (SiCN), and/or silicon oxynitride (SiON). The main pattern 145 may include a material harder than silicon oxide, such as a metal compound, silicon nitride, silicon carbide nitride, and/or silicon oxynitride.

Figure 2F:
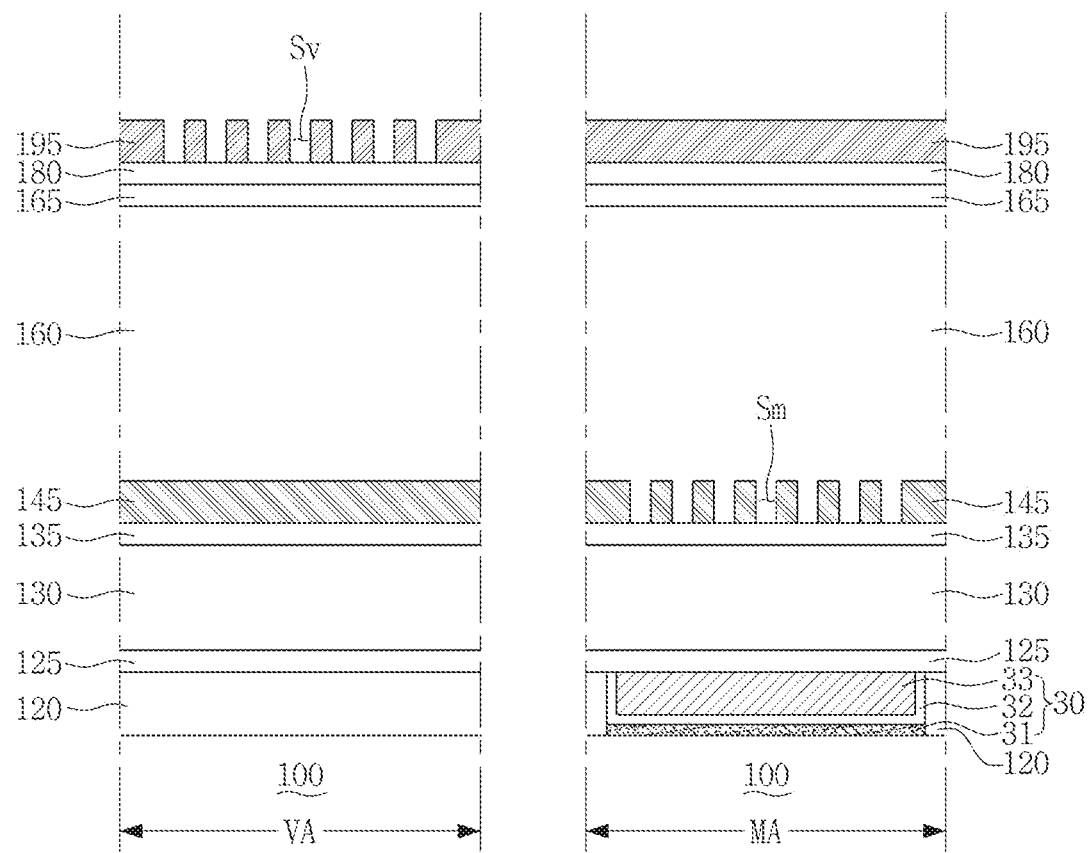

Referring to FIG. 2F, the method may include forming a sacrificial layer 160, a sacrificial capping layer 165, an anti-reflective layer 180, and a vernier pattern 195 on the main pattern 145. The vernier pattern 195 may include a plurality of parallel vernier slits Sv in the vernier rule area VA. The vernier pattern 195 may not have any patterns in the main rule area MA. The sacrificial layer 160 may have an etch selectivity with respect to silicon oxide and silicon nitride. For example, the sacrificial layer 160 may include silicon oxide containing carbon such as a spin on hardmask (SOH). The sacrificial capping layer 165 may have an etch selectivity with respect to the sacrificial layer 160. For example, the sacrificial capping layer 165 may include any one of silicon nitride, silicon oxynitride, or silicon carbide nitride. The anti-reflective layer 180 may include organic polymers and/or minerals. The vernier pattern 195 may include a photoresist.

Figure 2G:
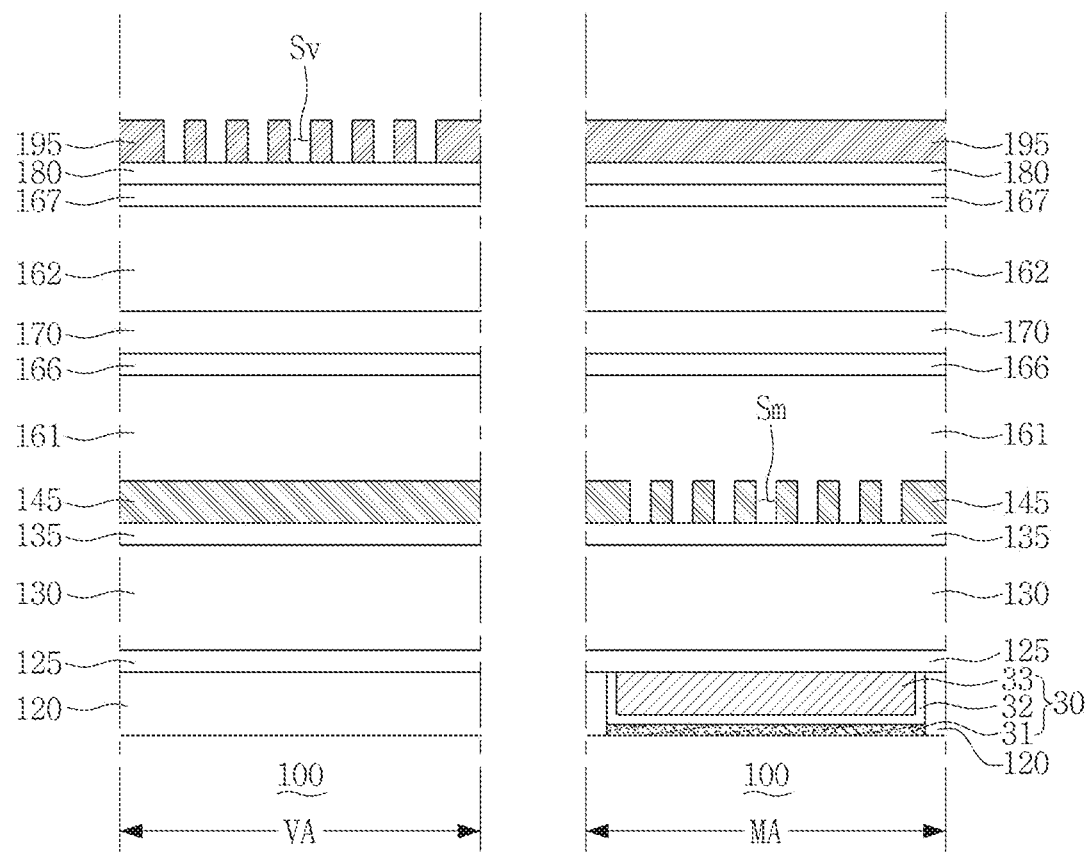

FIG. 2G is a longitudinal sectional view for describing methods of forming an overlay mark in accordance with further embodiments of the inventive concepts. Referring to FIG. 2G, the methods may include forming a lower sacrificial layer 161, a lower sacrificial capping layer 166, an intermediate mask layer 170, an upper sacrificial layer 162, an upper sacrificial capping layer 167, an anti-reflective layer 180, and a vernier pattern 195 on the main pattern 14 after performing the processes described with reference to FIGS. 2A to 2E.

The lower sacrificial layer 161 and the upper sacrificial layer 162 may have an etch selectivity with respect to silicon oxide and silicon nitride. For example, the lower sacrificial layer 161 and the upper sacrificial layer 162 may include silicon oxide containing carbon such as a SOH. The lower sacrificial capping layer 166 and the upper sacrificial capping layer 167 may have an etch selectivity with respect to the lower sacrificial layer 161, the upper sacrificial layer 162, and the intermediate mask layer 170. For example, the lower sacrificial capping layer 166 and the upper sacrificial capping layer 167 may include silicon nitride, silicon oxynitride, and/or silicon carbide nitride. The intermediate mask layer 170 may have an etch selectivity with respect to the lower sacrificial layer 161, the lower sacrificial capping layer 166, the upper sacrificial layer 162, and the upper sacrificial capping layer 167. For example, the intermediate mask layer 170 may include a silicon oxide such as TEOS.

Since the overlay marks formed by methods in accordance with embodiments of the inventive concepts include the mirror pattern 30 disposed under the main pattern 145 formed at a lower level, optical contrast of the main pattern 145 may be significantly improved. Therefore, an alignment of the main pattern 145 and the vernier pattern 195 may be more easily determined in an overlay inspection process.

Figure 3A:
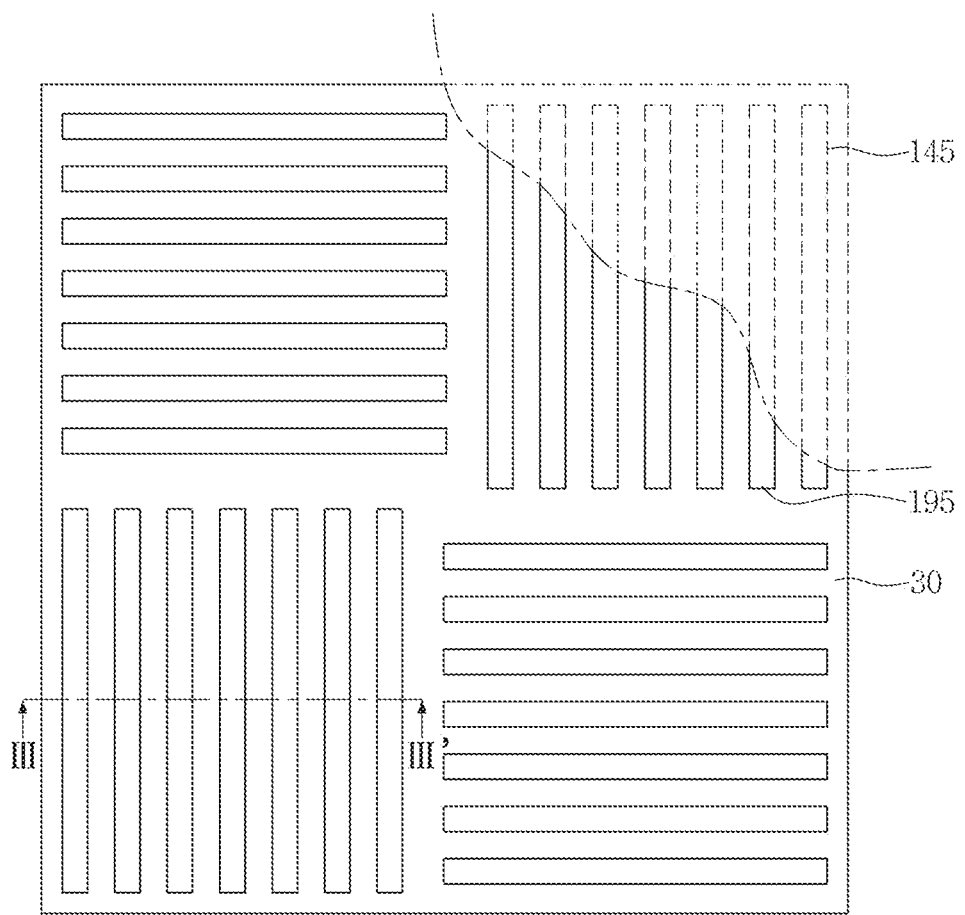
FIG. 3A is a layout of an overlay mark in accordance with some embodiments of the inventive concepts.
Figure 3B:
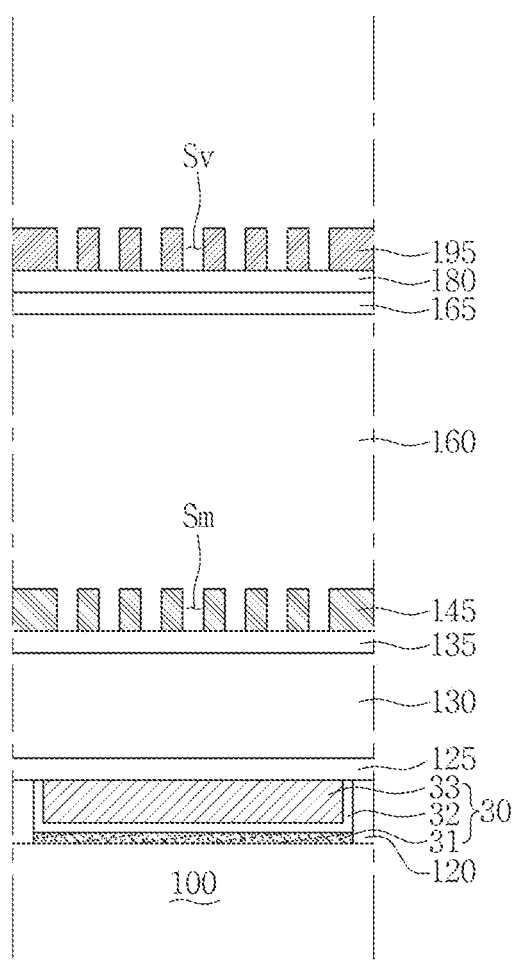
FIGS. 3B and 3C are longitudinal or cross-sectional views taken along line shown in FIG. 3A.
Figure 3C:
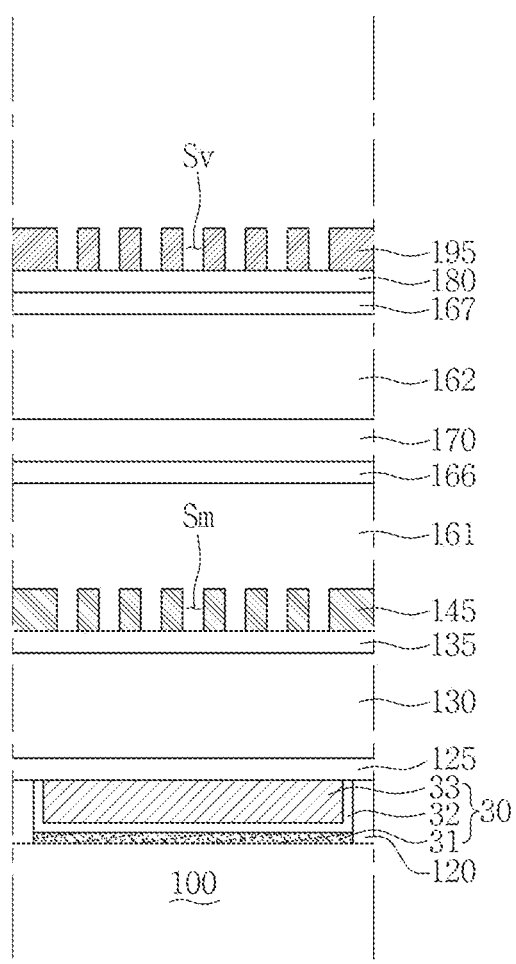

FIG. 3A is a partially projected layout of an overlay mark in accordance with some embodiments of the inventive concepts, and FIGS. 3B and 3C are longitudinal cross-sectional views taken along line shown in FIG. 3A. A solid line refers to a vernier pattern 195, and a dashed line refers to a main pattern 145. Referring to FIGS. 3A to 3C, the overlay mark may include a vernier pattern 195, a main pattern 145, and a mirror pattern 30, which vertically overlap each other in plan view. Components which are not described may be understood with reference to FIGS. 2A to 2G. In FIGS. 3A to 3C, the vernier pattern 195 and the main pattern 145 are aligned with one another in plan view, and both the vernier pattern 195 and the main pattern 145 extend within the boundary of the mirror pattern 30 in plan view.

Figure 4:
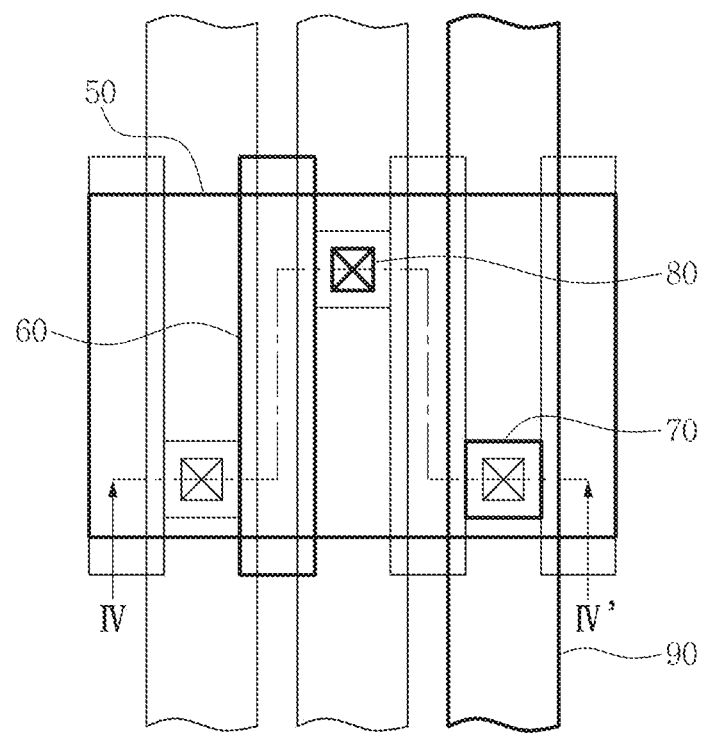
FIG. 4 is a layout or plan view of a semiconductor device in accordance with some embodiments of the inventive concepts.

FIG. 4 is a layout or plan view of a semiconductor device in accordance with some embodiments of the inventive concepts. Referring to FIG. 4, the semiconductor device in accordance with embodiments of the inventive concepts may include parallel bar-shaped gate patterns 60 extending across an active area 50, contact patterns 70 aligned on the active area 50 between the gate patterns 60, via patterns 80 vertically aligned with and overlapping the contact patterns 70, and interconnection patterns 90 vertically aligned with and overlapping the via patterns 80 and in parallel with the gate patterns 60.

FIGS. 5A to 5I are cross-sectional views for describing methods of forming interconnection-via patterns of a semiconductor device using an overlay mark in accordance with some embodiments of the inventive concepts. FIGS. 5A to 5I each are longitudinal cross-sectional views taken along lines IV-IV' shown in FIG. 4 and I-I' and II-II' shown in FIG. 1A.

Referring to FIG. 5A, the methods of forming interconnection-via patterns of the semiconductor device using the overlay mark in accordance with embodiments of the inventive concepts may include preparing a substrate 100 including a circuit area CA and an overlay mark area including a vernier rule area VA and a main rule area MA, forming isolation areas 101 in the substrate 100 of the circuit area CA to define an active area 103, forming gate patterns 110 on the substrate 100, and forming a lower interlayer insulating layer 120 on the substrate 100 to surround the gate patterns 110.

The substrate 100 may include a silicon wafer. The vernier rule area VA and the main rule area MA may be disposed in a scribe lane. The isolation areas 101 may include shallow trench isolation regions (STIs). The gate patterns 110 each may include a gate insulating layer 111, a gate electrode 112, and a gate spacer 113. The gate insulating layer 111 may include oxidized silicon. The gate electrode 112 may include a metal. The gate spacer 113 may surround the gate insulating layer 111 and the gate electrode 112. The lower interlayer insulating layer 120 may surround side surfaces of the gate patterns 110. The lower interlayer insulating layer 120 may include a silicon oxide such as TEOS.

Figure 5B:
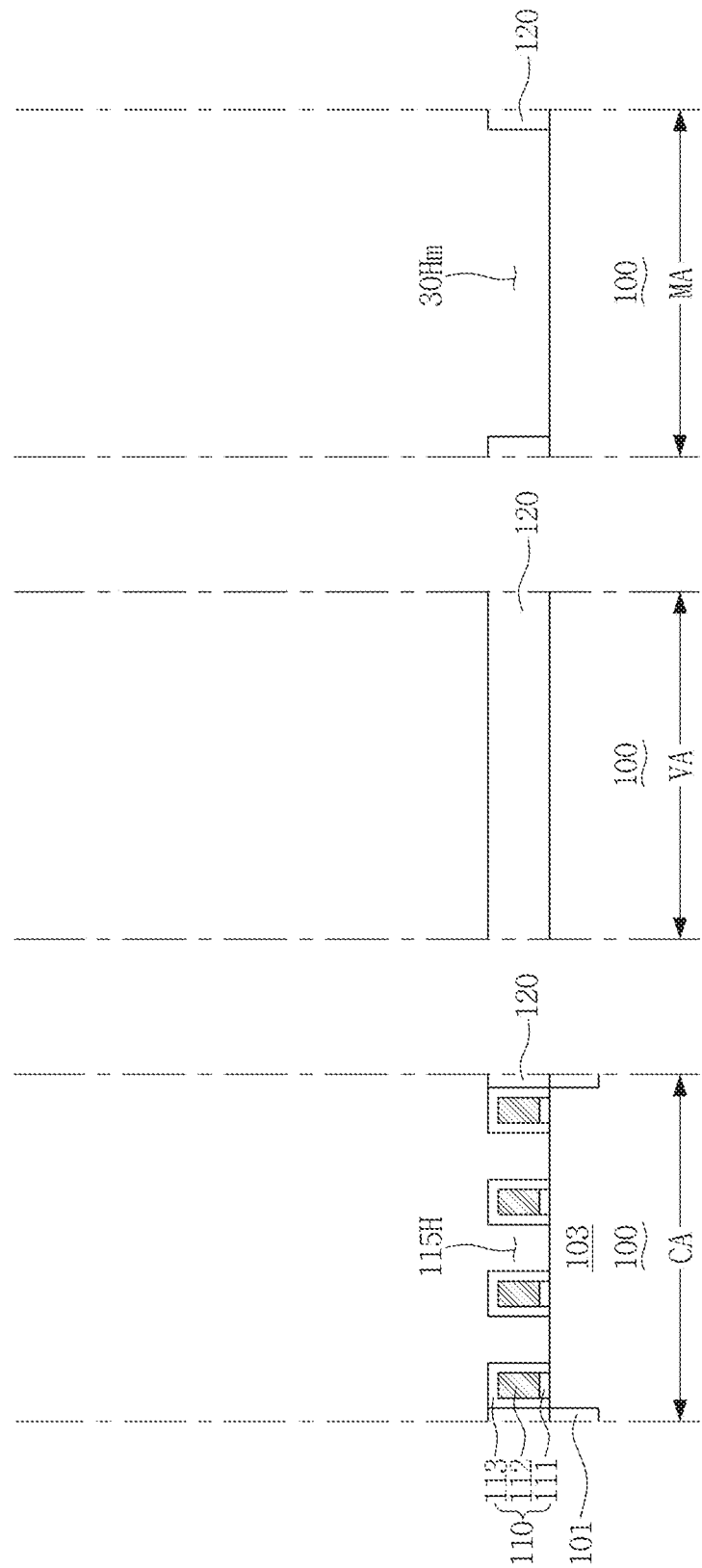

Referring to FIG. 5B, the method may include selectively etching the lower interlayer insulating layer 120, forming contact holes or openings 115H in the circuit area CA and a mirror hole or opening or trench 30Hm in the main rule area MA. The contact holes 115H and the mirror hole 30Hm may expose the surface of the substrate 100.

Referring to FIG. 5C, the method may include forming contact silicide layers 116 and a mirror silicide layer 31m on the surfaces of the substrate 100 exposed in the contact holes 115H and the mirror hole 30Hm, respectively. The forming of the contact silicide layers 116 and the mirror silicide layer 31m may include forming a metal layer on the exposed substrate 100 and performing a silicidation process. The metal layer may include tungsten (W), titanium (Ti), nickel (Ni), cobalt (Co), and/or another metal. Therefore, the contact silicide layers 116 and the mirror silicide layer 31m may include tungsten silicide (WSi), titanium silicide (TiSi), nickel silicide (NiSi), cobalt silicide (CoSi), and/or another metal silicide.

Figure 5D:
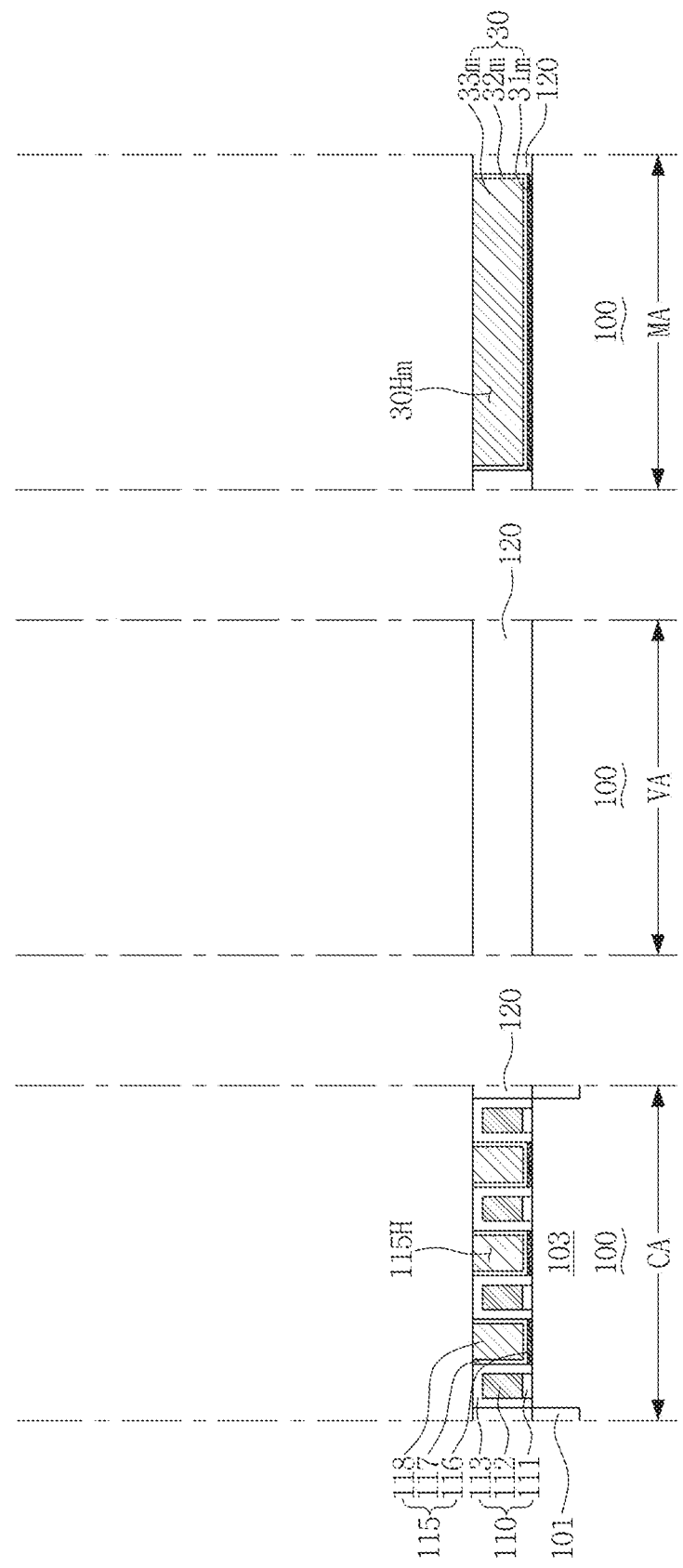

Referring to FIG. 5D, the method may include forming contact patterns 115 and a mirror pattern 30. The forming of the contact patterns 115 may include conformally forming contact barrier layers 117 on inside walls of the contact holes 115H and the contact silicide layers 116, forming contact plugs 118 on the contact barrier layers 117 to fill the contact holes 115H, and planarizing upper surfaces of the contact barrier layers 117 and upper surfaces of the contact plugs 118 by performing a CMP process. The forming of the mirror pattern 30 may include conformally forming a mirror barrier layer 32m on the mirror silicide layer 31m in the mirror hole 30Hm, forming a mirror plate 33m on the mirror barrier layer 32m to fill the mirror hole 30Hm, and planarizing an upper surface of the mirror barrier layer 32m and an upper surface of the mirror plate 33m by performing a CMP process. The mirror pattern 30 may be formed simultaneously and coplanar with the contact patterns 115 in a same fabrication step. As such, the layers 31m, 32m, and 33m of the mirror pattern 30 may be formed of the same materials as the layers 116, 117, and 118 of the contact patterns 115, respectively. For example, the contact barrier layers 117 and the mirror barrier layer 32m may include a metal nitride such as titanium nitride (TiN). The contact plugs 118 and the mirror plate 33m may include a reflective metal such as tungsten.

Figure 5E:
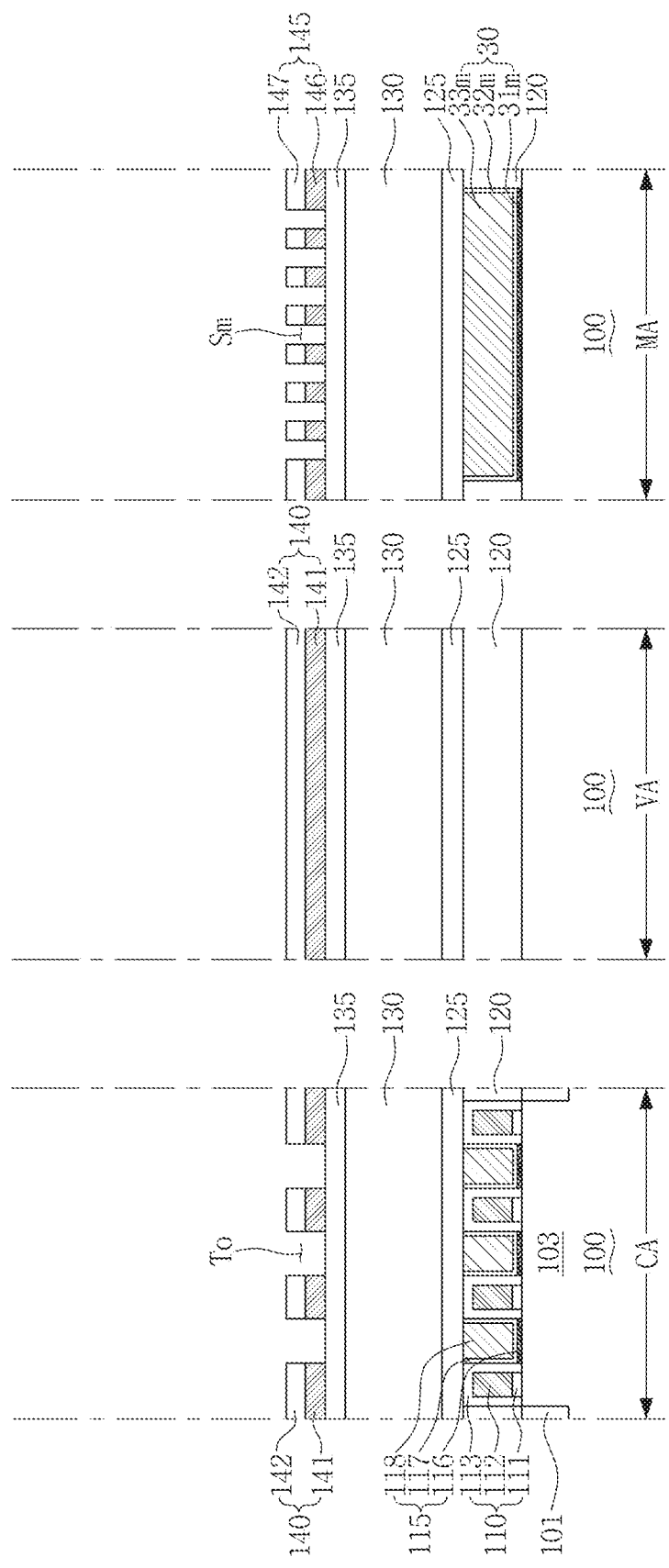

Referring to FIG. 5E, the method may include forming a lower stopping insulating layer 125, an upper interlayer insulating layer 130, and an upper stopping insulating layer 135 on the contact patterns 115 and the mirror pattern 30, and forming a trench mask 140 on the upper stopping insulating layer 135. The trench mask 140 may have trench openings To vertically aligned with the contact plugs 118 in the circuit area CA and main patterns 145 including main slits Sm vertically overlapping with the mirror plate 33m in the main rule area MA.

The lower stopping insulating layer 125 and the upper stopping insulating layer 135 may include a material having an etch selectivity with respect to the lower interlayer insulating layer 120 and the upper interlayer insulating layer 130 such as silicon nitride, silicon carbide nitride, and/or silicon oxynitride. The upper interlayer insulating layer 130 may include an insulating material whose permittivity is lower than that of silicon dioxide ($SiO_2$), such as OMCTS.

The trench mask 140 may include a lower trench mask 141 and an upper trench mask 142. For example, the lower trench mask 141 may include a material harder than the upper stopping insulating layer 135, such as titanium nitride. The upper trench mask 142 may include silicon nitride, silicon oxynitride, or silicon carbide nitride. The main pattern 145 may include a lower main pattern 146 and an upper main pattern 147. The lower main pattern 146 may include the same material as the lower trench mask 141, and the upper main pattern 147 may include the same material as the upper trench mask 142.

Referring to FIG. 5F, the method may include forming a sacrificial layer 160, a sacrificial capping layer 165, an anti-reflective layer 180, and a via mask 190 on the trench mask 140. The via mask 190 may have via openings Vo vertically aligned with the trench openings To in the circuit area CA, and a vernier pattern 195 including vernier slits Sv horizontally aligned but not vertically overlapping with the main slits Sm in the vernier rule area VA in a top or plan view or a layout.

The sacrificial layer 160 may fill the trench openings To of the trench mask 140 and the main slits Sm. The sacrificial layer 160 may have an etch selectivity with respect to the trench mask 140. For example, the sacrificial layer 160 may include silicon oxide containing carbon to have an etch selectivity with respect to silicon dioxide ($SiO_2$), such as a SOH. The sacrificial capping layer 165 may have an etch selectivity with respect to the sacrificial layer 160. For example, the sacrificial capping layer 165 may include any one of silicon nitride, silicon oxynitride, or silicon carbide nitride.

The anti-reflective layer 180 may include organic polymers and/or minerals. The anti-reflective layer 180 and the via mask 190 may be removed at the same time or otherwise in a same fabrication step. The via mask 190 may include a soft mask such as photoresist, or a hard mask including silicon oxide or silicon nitride.

In this process, a horizontal alignment degree of the main slits Sm and the vernier slits Sv may be measured and an overlay alignment degree of the trench mask 140 and the via mask 190 may be inspected.

Figure 5G:
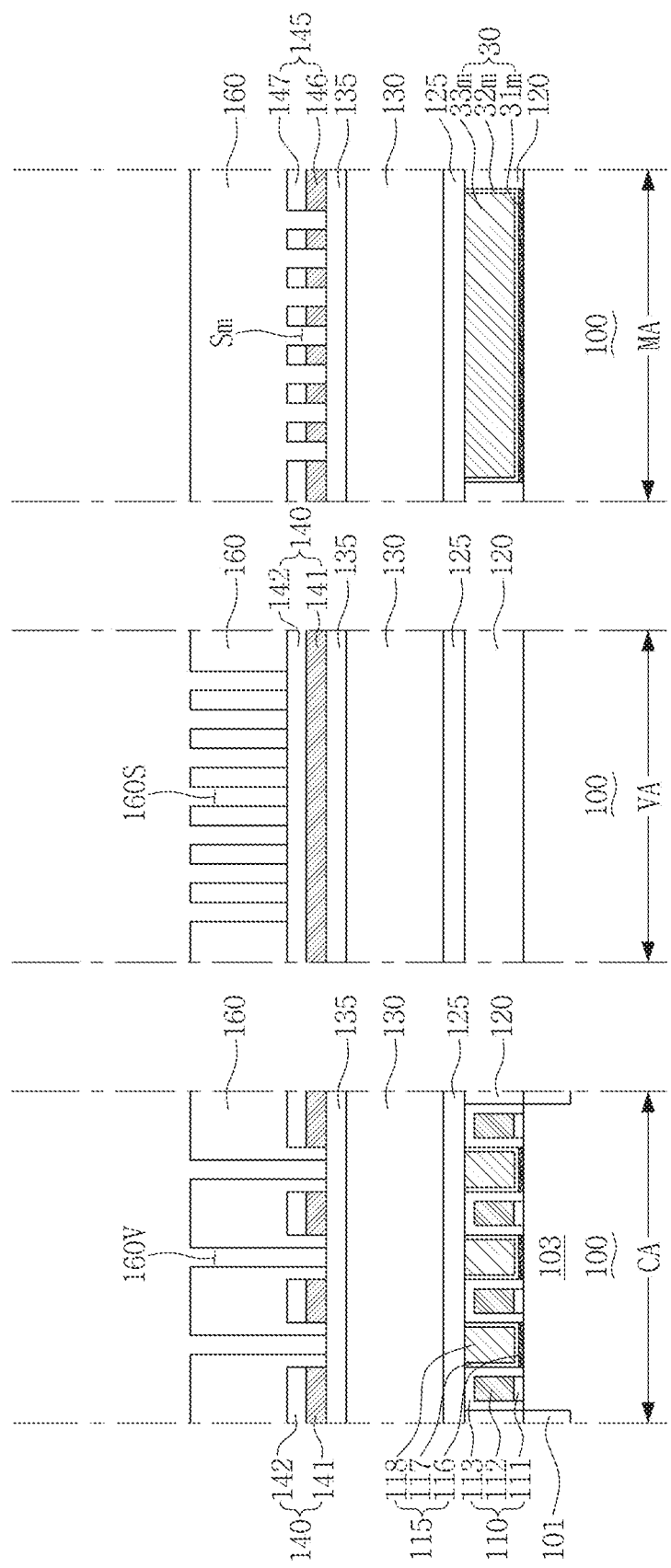

Referring to FIG. 5G, the method may include selectively etching the anti-reflective layer 180, the sacrificial capping layer 165, and the sacrificial layer 160 using the via mask 190 as an etch mask, and forming sacrificial via holes 160V and sacrificial vernier slits 160S that selectively expose upper surfaces of the upper stopping insulating layer 135 and/or the trench mask 140. The via mask 190, the anti-reflective layer 180, and the sacrificial capping layer 165 may be consumed or removed. A height of the sacrificial layer 160 may be reduced.

Referring to FIG. 5H, the method may include entirely or selectively etching the sacrificial layer 160, the trench mask 140, the upper stopping insulating layer 135, the upper interlayer insulating layer 130, and the lower stopping insulating layer 125, and forming interconnection-via holes 150H that expose upper surfaces of the contact patterns 115. The interconnection-via holes 150H vertically pass through the upper interlayer insulating layer 130 and the lower stopping insulating layer 125 in the circuit area CA. The interconnection-via holes 150H may include interconnection trenches 150T in an upper area of the upper interlayer insulating layer 130 and via holes 150V in a lower area of the upper interlayer insulating layer 130.

The sacrificial layer 160, the trench mask 140, and the upper stopping insulating layer 135 may be consumed or removed.

Figure 5I:
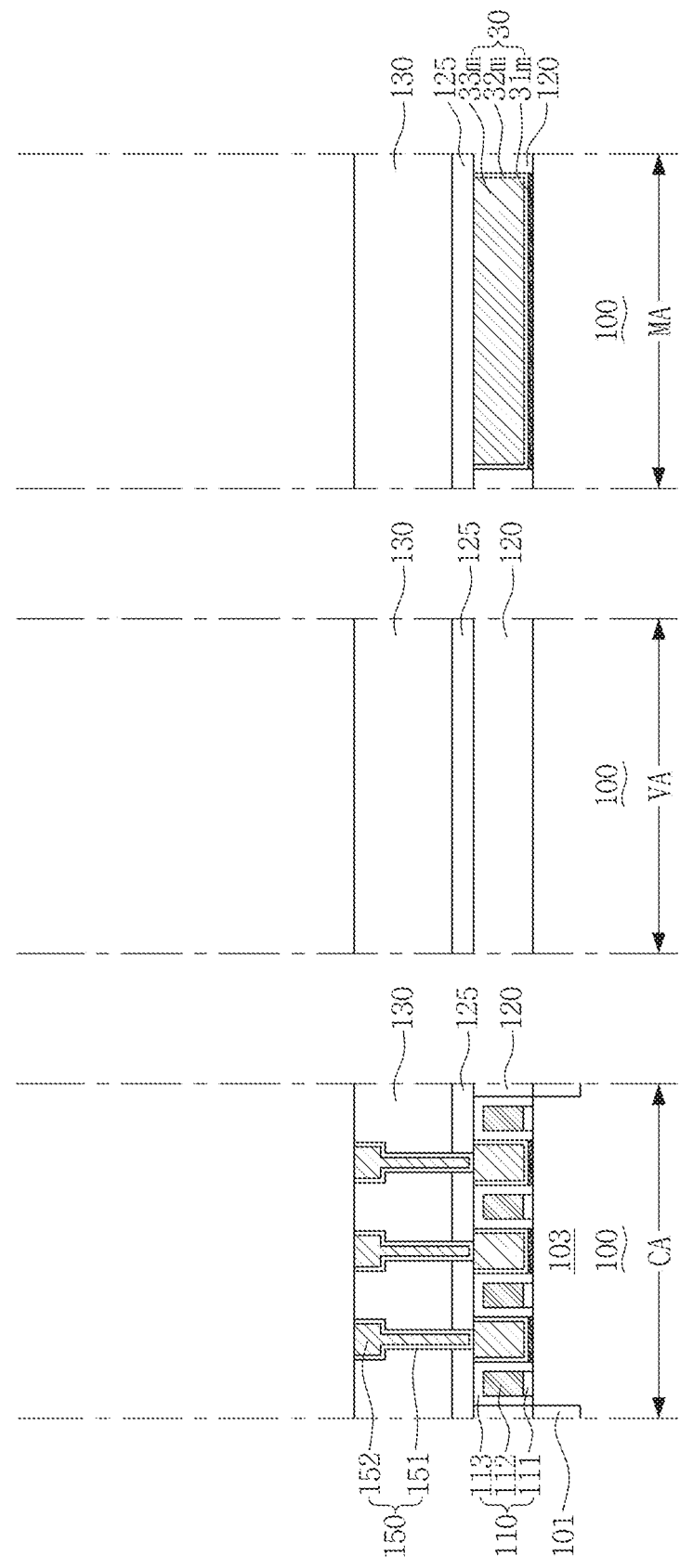

Referring to FIG. 5I, the method may include forming interconnection-via patterns 150 having interconnection-via barrier layers 151 and interconnection-via plugs 152 in the interconnection-via holes 150H to provide electrical connections to the contact patterns 115. The mirror pattern 30 remains in the main rule area MA on the same level and coplanar with the contact patterns 115 between the gate patterns 110.

FIGS. 6A to 6D are cross-sectional views for describing methods of fabricating semiconductor devices having interconnection-via patterns using an overlay mark in accordance with some embodiments of the inventive concepts.

Figure 6A:
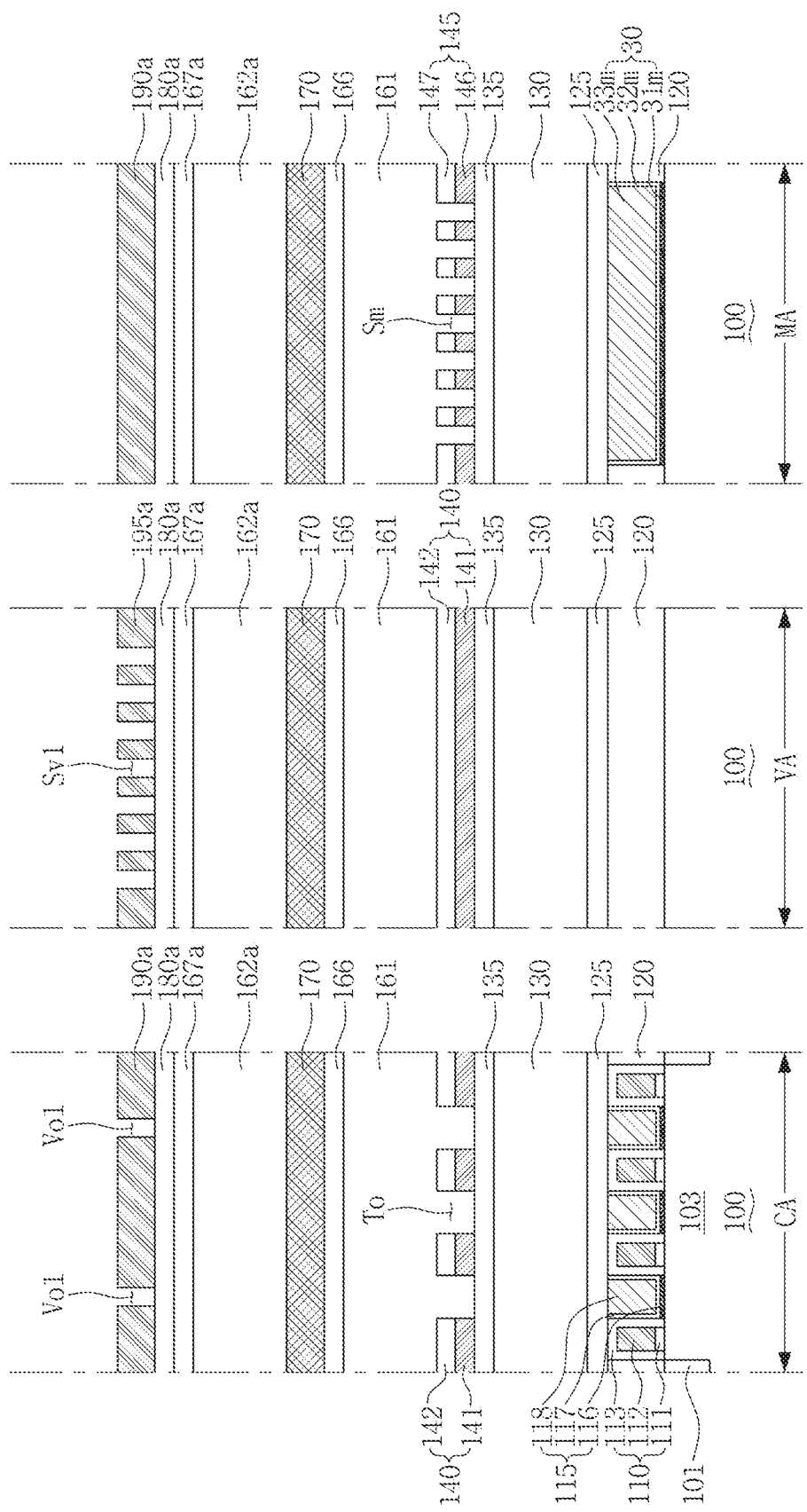
FIGS. 6A to 6D are cross-sectional views illustrating methods of fabricating semiconductor devices having interconnection-via patterns using an overlay mark in accordance with some embodiments of the inventive concepts.

Referring to FIG. 6A, the method may include forming isolation areas 101 that define an active area 103 in a substrate 100, forming gate patterns 110, a lower interlayer insulating layer 120, contact patterns 115, a mirror pattern 30, a lower stopping insulating layer 125, an upper interlayer insulating layer 130, an upper stopping insulating layer 135, and a trench mask 140 on the substrate 100, and forming a lower sacrificial layer 161, a lower sacrificial capping layer 166, an intermediate mask layer 170, a first upper sacrificial layer 162a, a first upper sacrificial capping layer 167a, a first anti-reflective layer 180a, and a first via mask 190a on the trench mask 140 by performing the processes described with reference to FIGS. 5A to 5F.

The trench mask 140 may have trench openings To vertically aligned with some of the contact plugs 118 in a circuit area CA, and main patterns 145 including main slits Sm vertically aligned with and overlapping a mirror plate 33m in a main rule area MA.

The lower sacrificial layer 161 may have an etch selectivity with respect to the trench mask 140. For example, the lower sacrificial layer 161 may include silicon oxide containing carbon to have an etch selectivity with respect to silicon dioxide ($SiO_2$), such as a SOH.

The lower sacrificial capping layer 166 may have an etch selectivity with respect to the lower sacrificial layer 161. For example, the lower sacrificial capping layer 166 may include any one of silicon nitride, silicon oxynitride, and/or silicon carbide nitride.

The intermediate mask layer 170 may have an etch selectivity with respect to the lower sacrificial capping layer 166. For example, the intermediate mask layer 170 may include silicon oxide such as TEOS.

The first upper sacrificial layer 162a may have an etch selectivity with respect to the intermediate mask layer 170. For example, the first upper sacrificial layer 162a may include silicon oxide containing carbon to have an etch selectivity with respect to silicon dioxide ($SiO_2$), such as a SOH.

The first upper sacrificial capping layer 167a may have an etch selectivity with respect to the first upper sacrificial layer 162a. For example, the first upper sacrificial capping layer 167a may include silicon nitride, silicon oxynitride, and/or silicon carbide nitride.

The first anti-reflective layer 180a may include organic polymers and/or minerals. The first anti-reflective layer 180a and the first via mask 190a may be removed at the same time.

The first via mask 190a may include a photoresist. The first via mask 190a may have first via openings Vo1 vertically aligned with some of the trench openings To in the circuit area CA, and a first vernier pattern 195a including first vernier slits Sv1 horizontally aligned so as not to overlap with the main slits Sm in a vernier rule area VA in a top or plan view or a layout.

In this process, a horizontal alignment degree of the main slits Sm and the first vernier slits Sv1 may be measured, and an overlay alignment degree of the trench opening To of the trench mask 140 and the first via openings Vo1 of the first via mask 190a may be inspected in a top or plan view or a layout.

Figure 6B:
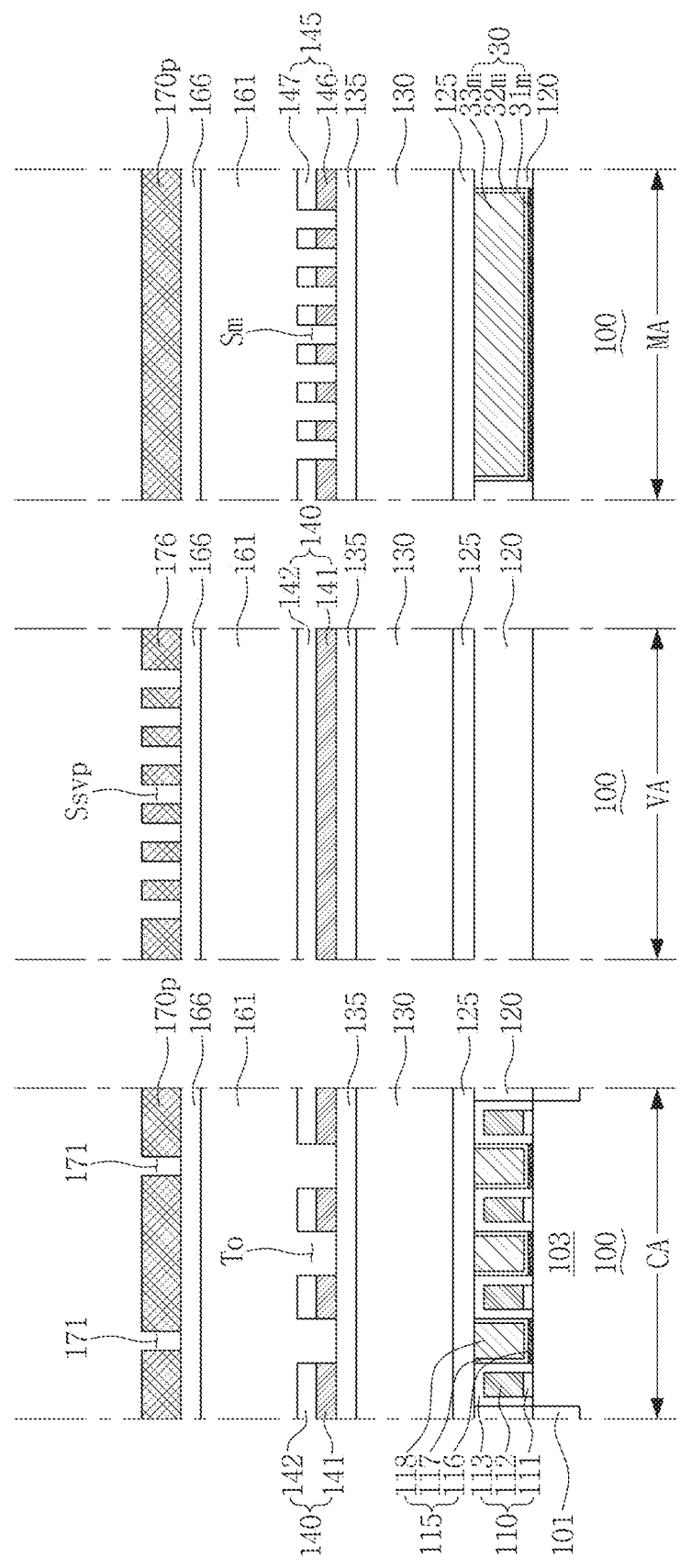

Referring to FIG. 6B, the method may include selectively etching the first anti-reflective layer 180a, the first upper sacrificial capping layer 167a, the first upper sacrificial layer 162a, and the intermediate mask layer 170 using the first via mask 190a as an etch mask, and forming a preliminary intermediate mask pattern 170p. The preliminary intermediate mask pattern 170p may include first intermediate via holes 171 vertically aligned with some of the trench openings To in the circuit area CA, and a sacrificial vernier pattern 176 having preliminary sacrificial vernier slits Ssvp in the vernier rule area VA.

Figure 6C:
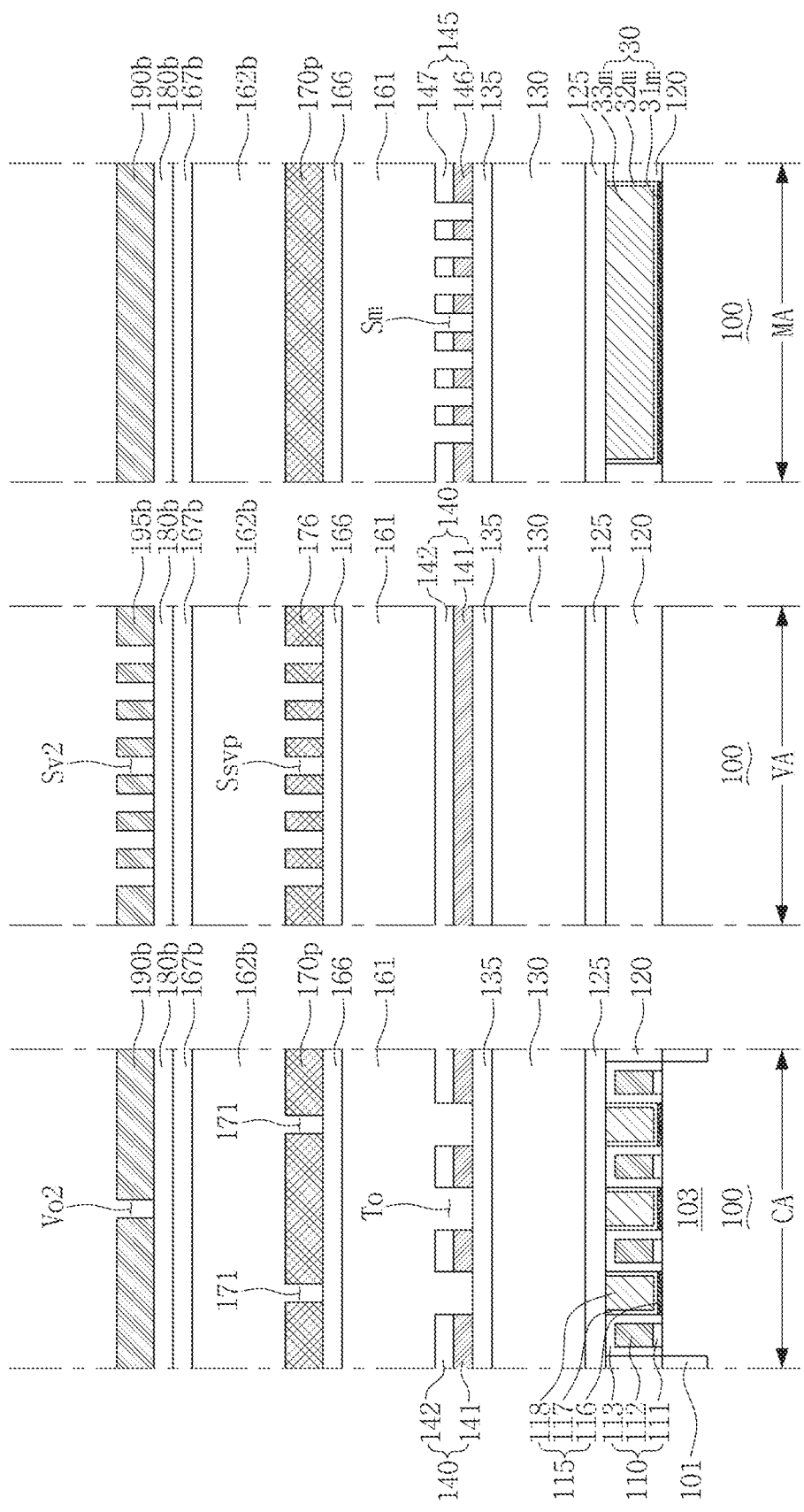

Referring to FIG. 6C, the method may include forming a second upper sacrificial layer 162b, a second upper sacrificial capping layer 167b, a second anti-reflective layer 180b, and a second via mask 190b on the preliminary intermediate mask pattern 170p.

The second upper sacrificial layer 162b may include the same material as the first upper sacrificial layer 162a, the second upper sacrificial capping layer 167b may include the same material as the first upper sacrificial capping layer 167a, the second anti-reflective layer 180b may include the same material as the first anti-reflective layer 180a, and the second via mask 190b may include the same material as the first via mask 190a.

The second via mask 190b may have a second via opening Vo2 vertically aligned between the first intermediate via holes 171 in the circuit area CA, and a second vernier pattern 195b including second vernier slits Sv2 horizontally aligned so as not to overlap with the main slits Sm in the vernier rule area VA in a top or plan view or a layout. The second vernier slits Sv2 may be vertically aligned with and may overlap the preliminary sacrificial vernier slits Ssvp.

In this process, a horizontal alignment degree of the main slits Sm and the second vernier slits Sv2 may be measured, and an overlay alignment degree of the trench openings To of the trench mask 140 and the second via openings Vo2 of the second via mask 190b may be inspected in a top or plan view or a layout.

Figure 6D:
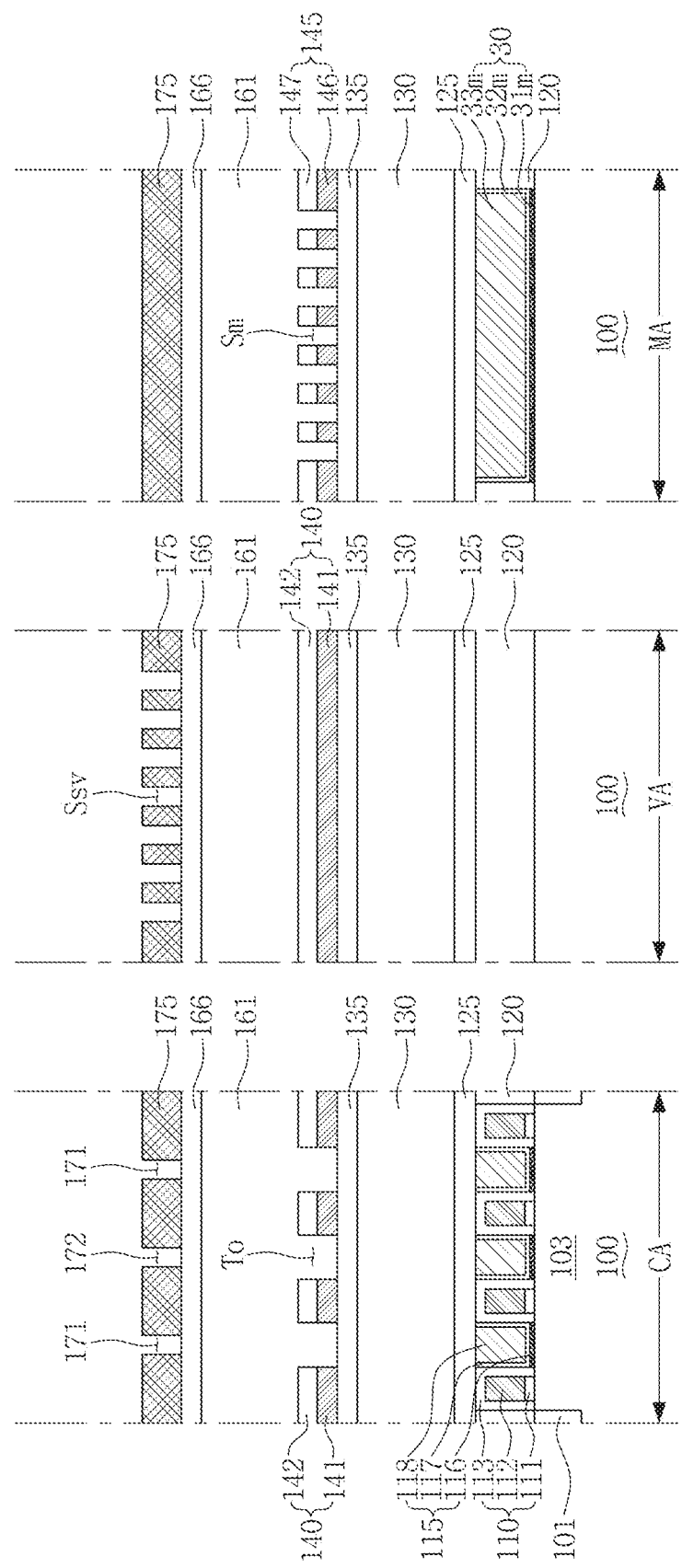

Referring to FIG. 6D, the method may include selectively etching the second anti-reflective layer 180b, the second upper sacrificial capping layer 167b, the second upper sacrificial layer 162b, and the preliminary intermediate mask pattern 170p using the second via mask 190b as an etch mask, and forming an intermediate mask pattern 175. The intermediate mask pattern 175 may include first intermediate via holes 171 and a second intermediate via hole 172 vertically aligned with the trench openings To in the circuit area CA. The intermediate mask pattern 175 may include a sacrificial vernier slit Ssv in the vernier rule area VA.

Then, the method may include forming interconnection-via patterns by performing processes similar to those described with reference to FIGS. 5G to 5I.

Figure 7:
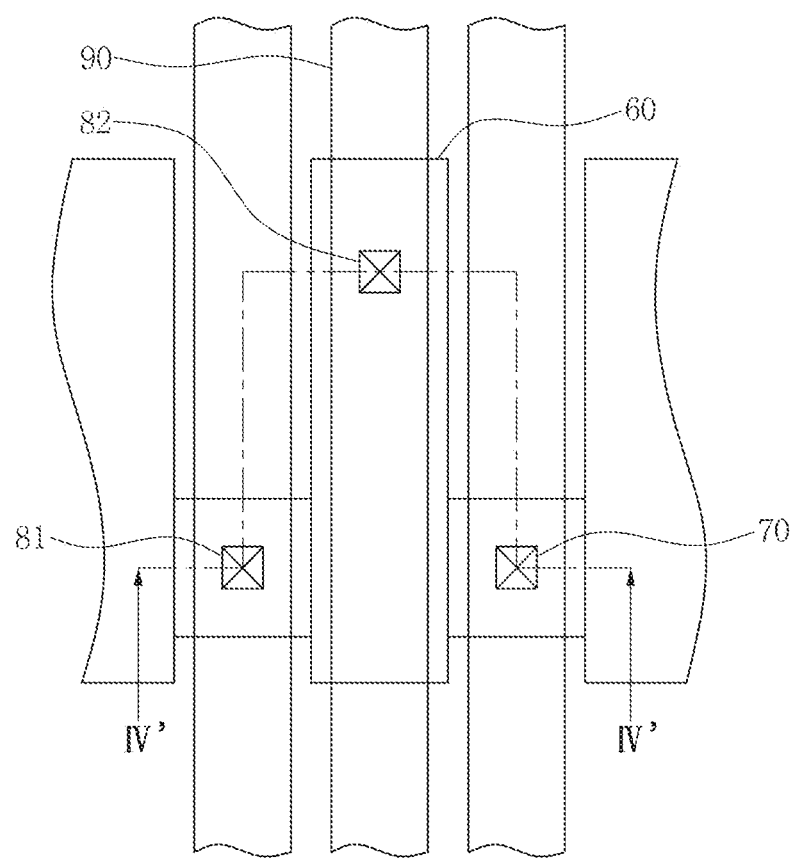
FIG. 7 is a layout or plan view of a semiconductor device in accordance with further embodiments of the inventive concepts.

FIG. 7 is a layout or plan view of a semiconductor device in accordance with further embodiments of the inventive concepts.

Referring to FIG. 7, the semiconductor device in accordance with the embodiment of the inventive concepts may include parallel gate patterns 60, contact patterns 70 aligned between the gate patterns 60, first via patterns 81, which are vertically aligned with and overlap the contact patterns 70, a second via pattern 82, which is vertically aligned with and overlaps one of the gate patterns 60, and a plurality of interconnection patterns 90, which are vertically aligned with and overlap the first via patterns 81 and the second via pattern 82.

FIGS. 8A to 8G are cross-sectional views for describing methods of fabricating semiconductor devices having interconnection-via patterns using an overlay mark in accordance with further embodiments of the inventive concepts.

Figure 8A:
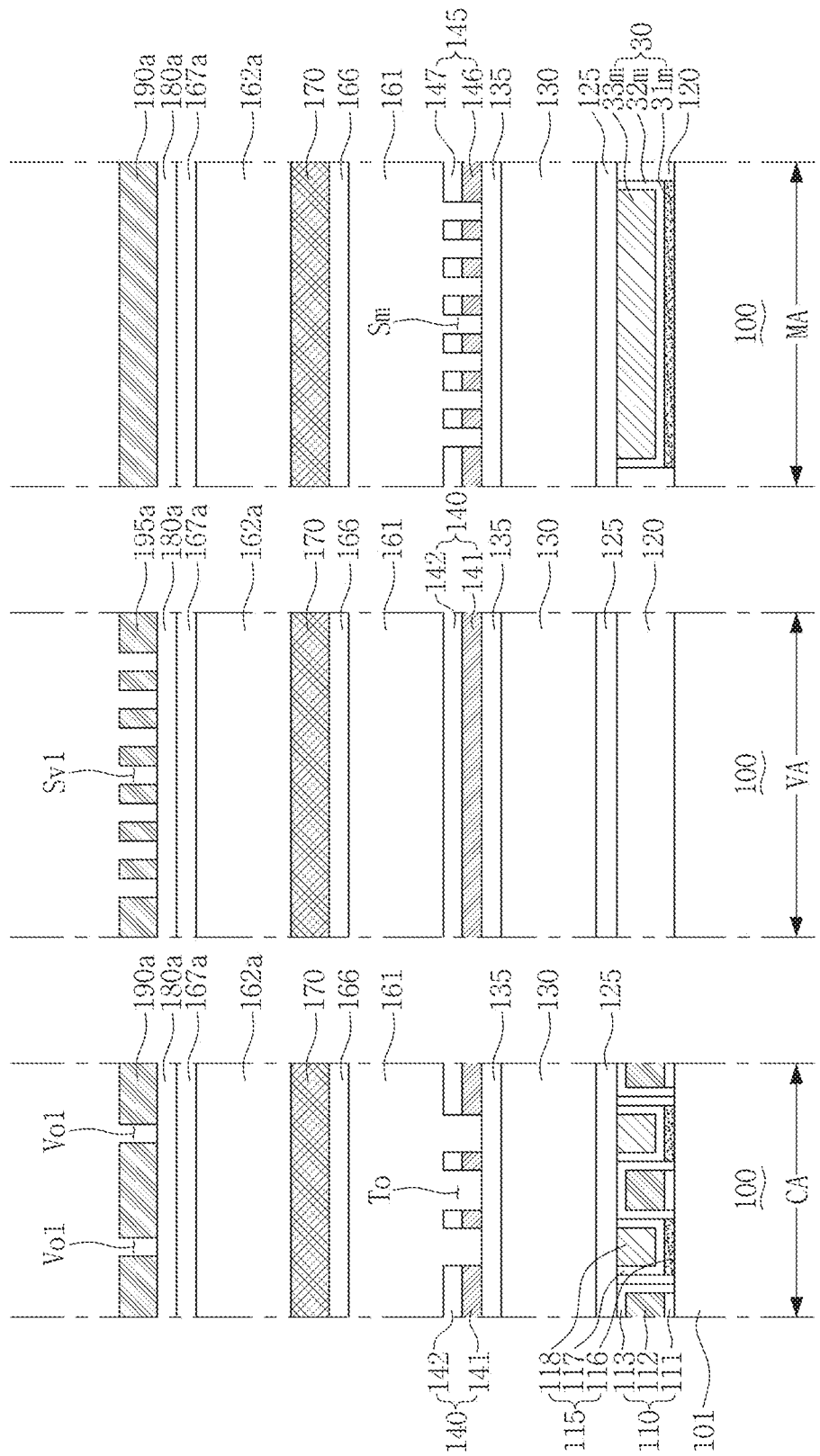
FIGS. 8A to 8G are cross-sectional views illustrating methods of fabricating semiconductor devices having interconnection-via patterns using an overlay mark in accordance with further embodiments of the inventive concepts.

Referring to FIG. 8A, the method may include forming gate patterns 110, contact patterns 115, a mirror pattern 30, a lower stopping insulating layer 125, an upper interlayer insulating layer 130, an upper stopping insulating layer 135, a trench mask 140, a lower sacrificial layer 161, a lower sacrificial capping layer 166, an intermediate mask layer 170, a first upper sacrificial layer 162a, a first upper sacrificial capping layer 167a, a first anti-reflective layer 180a, and a first via mask 190a on a substrate 100 by performing processes similar to those described with reference to FIGS. 5A to 5F and 6A. Descriptions for common elements may be understood with reference to FIG. 6A. In FIG. 8A, a horizontal alignment degree of the main slits Sm and the first vernier slits Sv1 may be measured, and an overlay alignment degree of the trench openings To of the trench mask 140 and first via openings Vo1 of the first via mask 190a may be inspected in a top or plan view or a layout.

Figure 8B:
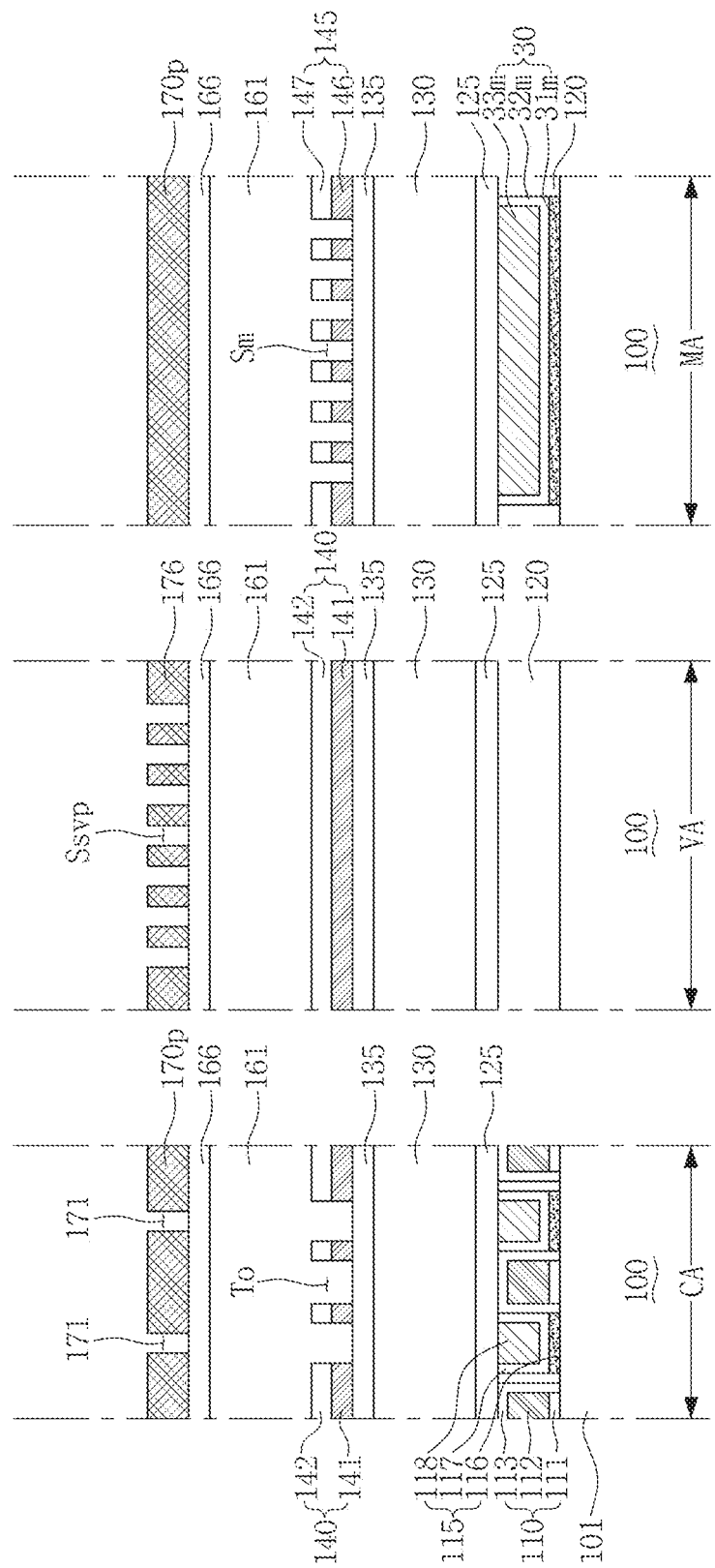

Referring to FIG. 8B, the method may include selectively etching the first anti-reflective layer 180a, the first upper sacrificial capping layer 167a, the first upper sacrificial layer 162a, and the intermediate mask layer 170 using the first via mask 190a as an etch mask, and forming a preliminary intermediate mask pattern 170p. The preliminary intermediate mask pattern 170p may include first intermediate via holes 171 vertically aligned with some of the trench openings To in a circuit area CA, and a sacrificial vernier pattern 176 having preliminary sacrificial vernier slits Ssvp in a vernier rule area VA.

Figure 8C:
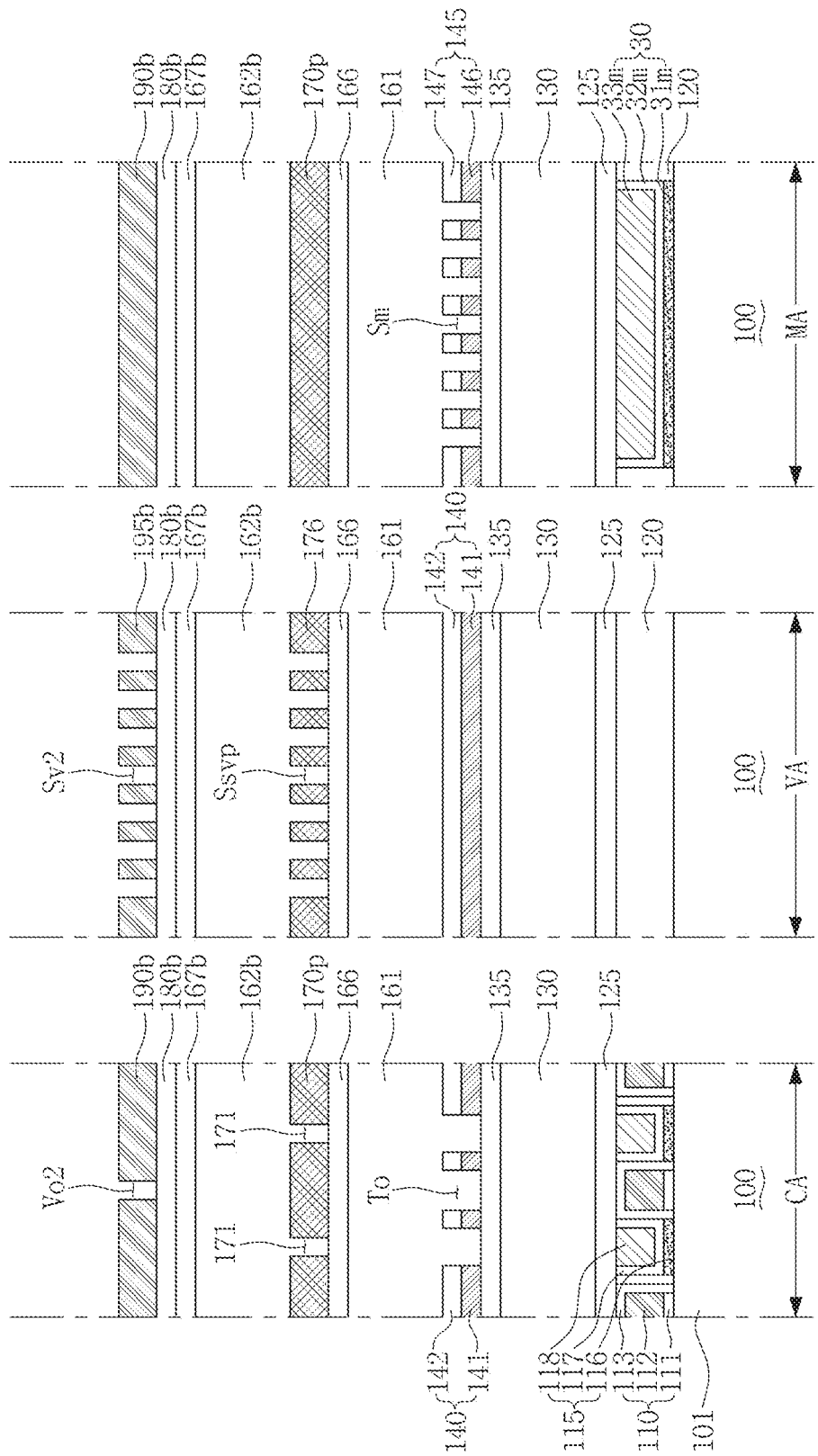

Referring to FIG. 8C, the method may include forming a second upper sacrificial layer 162b, a second upper sacrificial capping layer 167b, a second anti-reflective layer 180b, and a second via mask 190b on the preliminary intermediate mask pattern 170p.

The second via mask 190b may have a second via opening Vo2 vertically aligned between the first intermediate via holes 171 in the circuit area CA, and a second vernier pattern 195b including second vernier slits Sv2 in the vernier rule area VA horizontally aligned so as not to overlap with the main slits Sm in a top or plan view or a layout. The second vernier slits Sv2 may be vertically aligned with and may overlap the preliminary sacrificial vernier slits Ssvp. In FIG. 8C, a horizontal alignment degree of the main slits Sm and the second vernier slits Sv2 may be measured, and an overlay alignment degree of the trench openings To of the trench mask 140 and the second via openings Vo2 of the second via masks 190b may be inspected in a top or plan view or a layout.

Figure 8D:
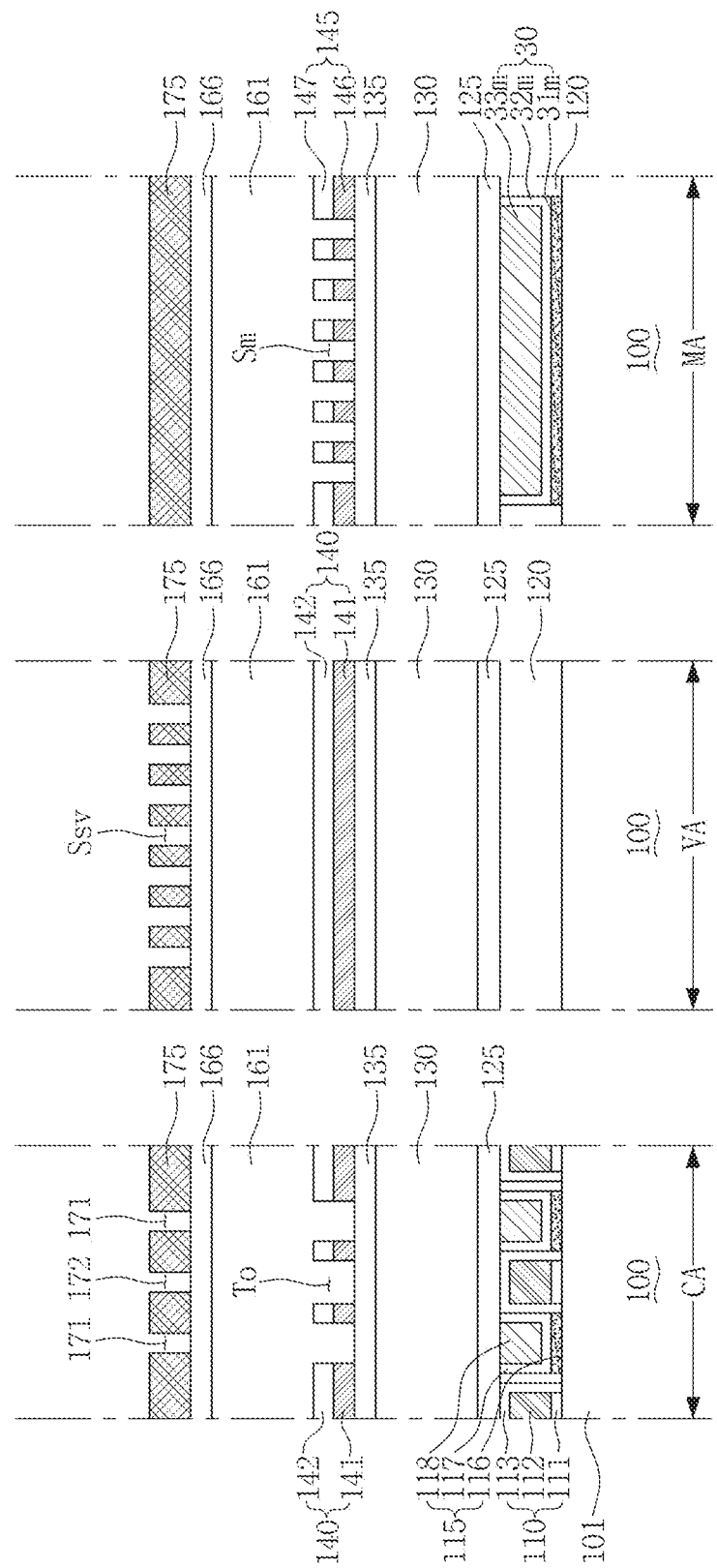

Referring to FIG. 8D, the method may include selectively etching the second anti-reflective layer 180b, the second upper sacrificial capping layer 167b, the second upper sacrificial layer 162b, and the preliminary intermediate mask pattern 170p using the second via mask 190b as an etch mask, forming an intermediate mask pattern 175. The intermediate mask pattern 175 may include first intermediate via holes 171 and a second intermediate via hole 172 vertically aligned with the trench openings To in the circuit area CA. The intermediate mask pattern 175 may include a sacrificial vernier slit Ssv in the vernier rule area VA.

Figure 8E:
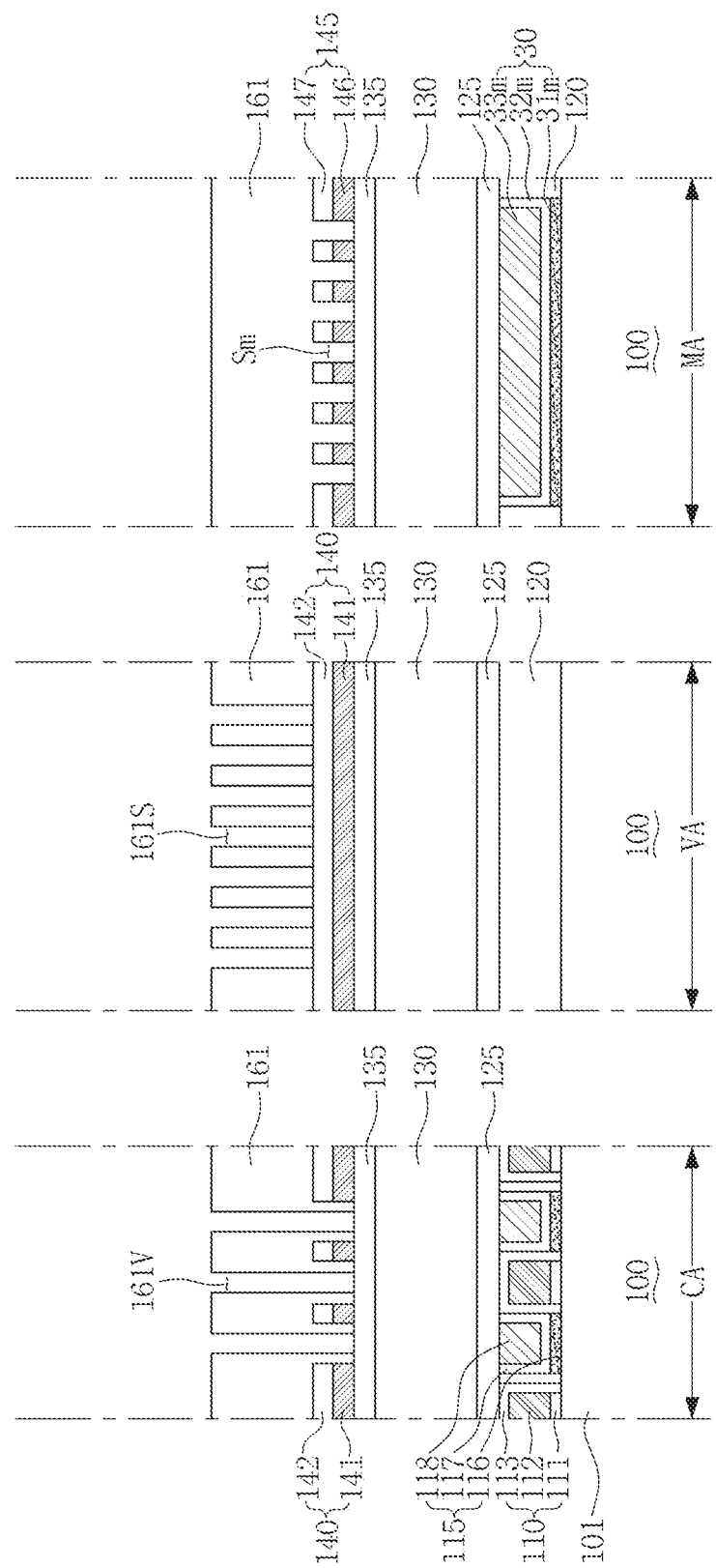

Referring to FIG. 8E, the method may include selectively etching the lower sacrificial capping layer 166, and lower sacrificial layer 161 using the intermediate mask pattern 175 as an etch mask, forming sacrificial via holes 161V and sacrificial vernier slits 161S that selectively expose an upper surface of the upper stop insulating layer 135 and/or the trench mask 140.

Figure 8F:
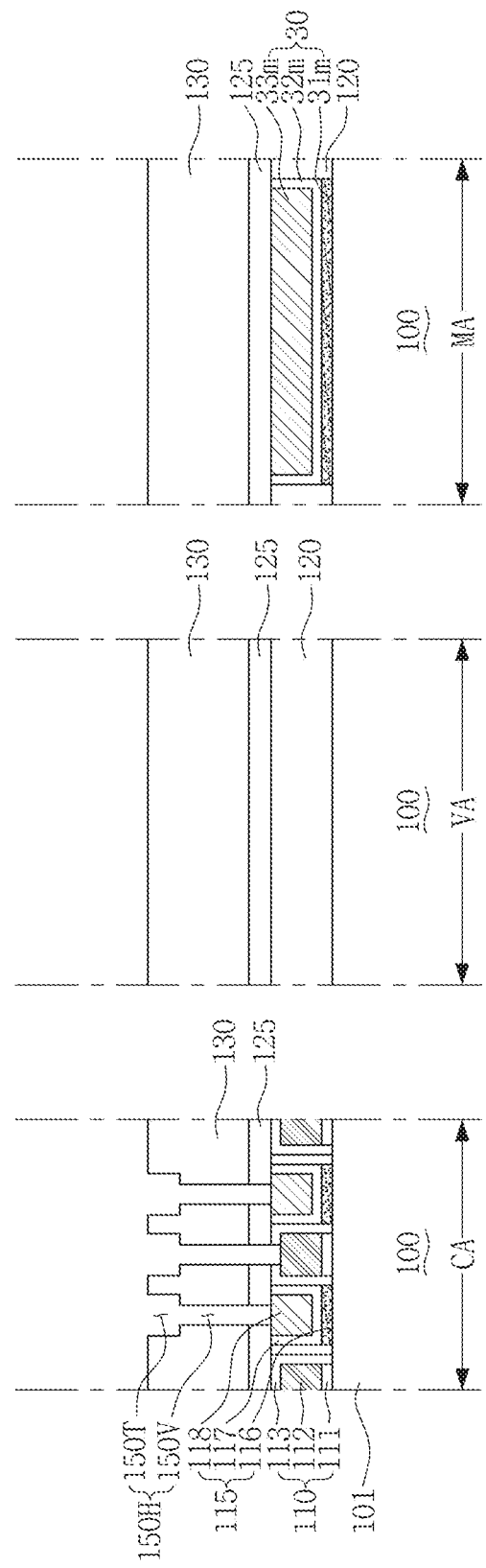

Referring to FIG. 8F, the method may include entirely or selectively etching the lower sacrificial layer 161, the trench mask 140, the upper stopping insulating layer 135, the upper interlayer insulating layer 130, and the lower stopping insulating layer 125, and forming interconnection-via holes 150H vertically passing through the upper interlayer insulating layer 130 and the lower stopping insulating layer 125 and exposing upper surfaces of the contact patterns 115 and a gate pattern 110 therebetween in the circuit area CA. The interconnection-via holes 150H may include interconnection trenches 150T in an upper area of the upper interlayer insulating layer 130 and via holes 150V in a lower area of the upper interlayer insulating layer 130.

Figure 8G:
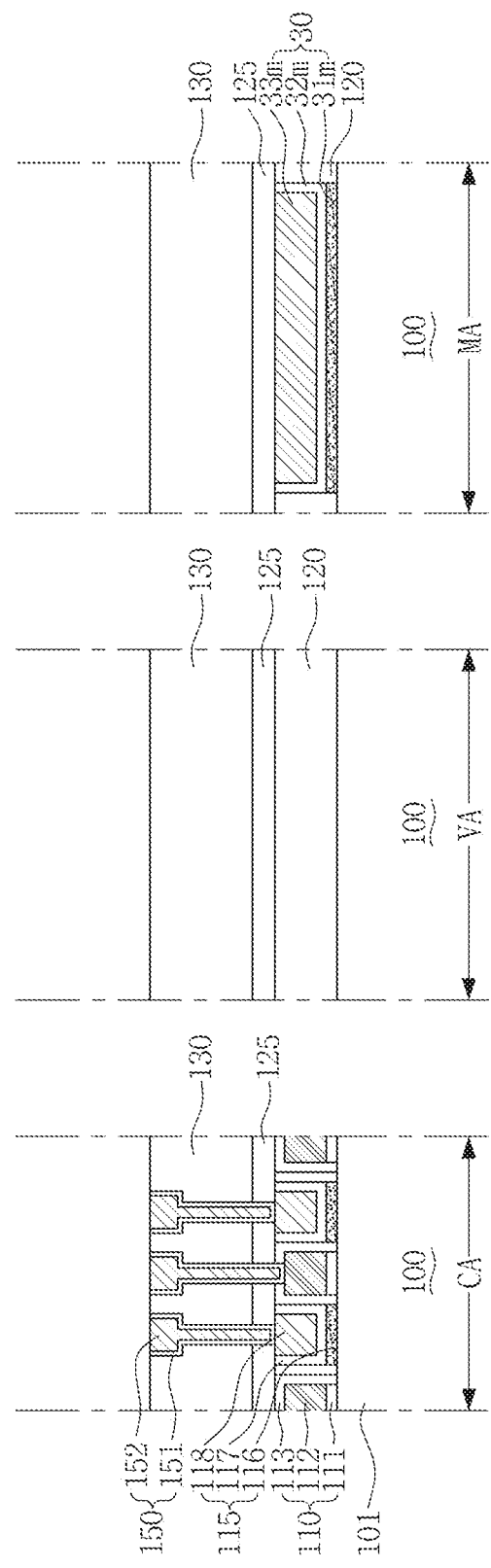

Referring to FIG. 8G, the method may include forming interconnection-via patterns 150 having interconnection-via barrier layers 151 and interconnection-via plugs 152 in the interconnection-via holes 150H to provide electrical connections to the contact patterns 115 and the gate pattern 110. The mirror pattern 30 remains in the main rule area MA on the same level and coplanar with the contact patterns 115.

Figure 9A:
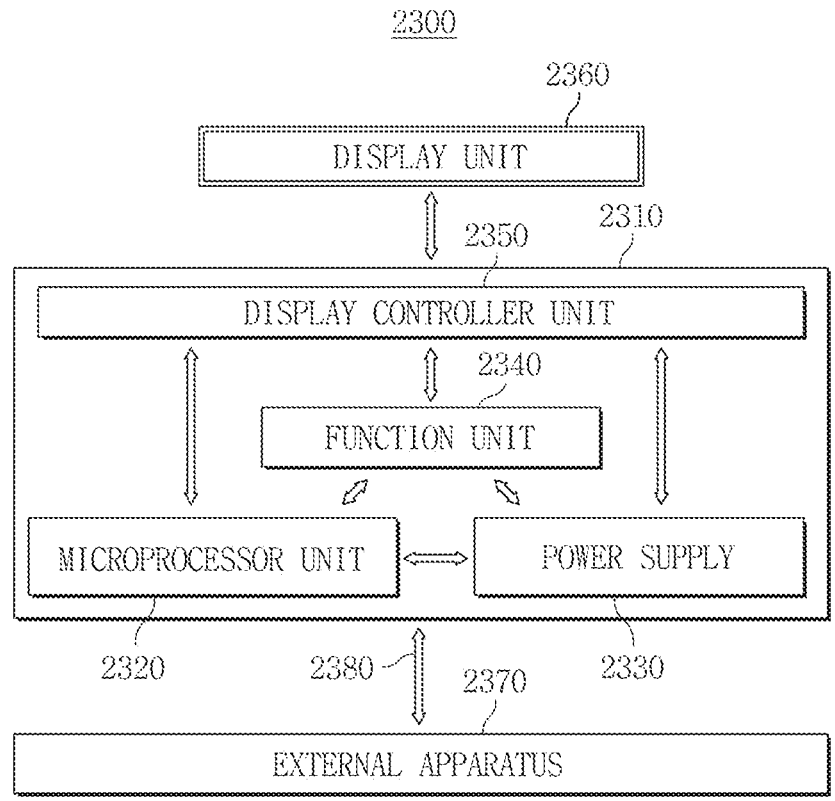
FIGS. 9A and 9B are conceptual block diagrams showing electronic systems in accordance with embodiments of the inventive concepts.

FIG. 9A is conceptual block diagram showing an electronic system 2300 in accordance with some embodiments of the inventive concepts. Referring to FIG. 9A, the electronic system 2300 in accordance with the embodiment of the inventive concepts may include a body 2310, a display unit 2360, and an external apparatus 2370. The body 2310 may include a microprocessor unit 2320, a power supply 2330, a function unit 2340, and/or a display controller unit 2350. The body 2310 may include a system board or a motherboard having a printed circuit board (PCB) or the like, and/or a case. The microprocessor unit 2320, the power supply 2330, the function unit 2340, and the display controller unit 2350 may be mounted or disposed on an upper surface of the body 2310 or inside the body 2310. The display unit 2360 may be disposed on the upper surface of the body 2310 or inside/outside the body 2310. The display unit 2360 may display an image processed by the display controller unit 2350. For example, the display unit 2360 may include a liquid crystal display (LCD), an active matrix organic light emitting diode (AMOLED), and/or various display panels. The display unit 2360 may include a touch screen. Therefore, the display unit 2360 may have an input/output function. The power supply 2330 may supply a current or a voltage to the microprocessor unit 2320, the function unit 2340, the display controller unit 2350, etc. The power supply 2330 may include a charging battery, a socket for a dry cell, and/or a voltage/current converter. The microprocessor unit 2320 may receive a voltage from the power supply 2330 to control the function unit 2340 and the display unit 2360. For example, the microprocessor unit 2320 may include a central processing unit (CPU) and/or an application processor (AP). The function unit 2340 may include a touch pad, a touch screen, a volatile/non-volatile memory, a memory card controller, a camera, a lighting, an audio and moving picture recording processor, a wireless radio antenna, a speaker, a microphone, a USB port, and/or a unit having other various functions. The microprocessor unit 2320 and/or the function unit 2340 may include the semiconductor device having interconnection-via patterns formed using an overlay mark in accordance with various embodiments of the inventive concepts.

Figure 9B:
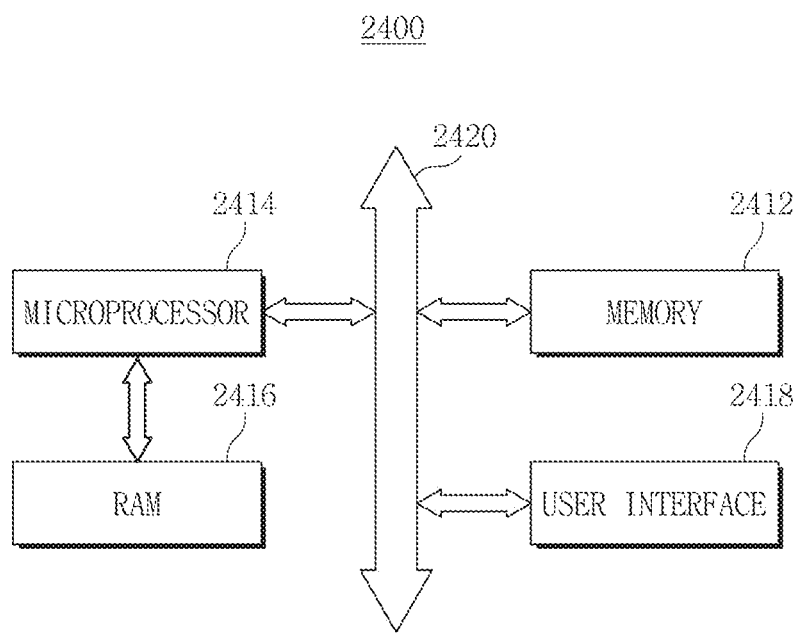

Referring to FIG. 9B, an electronic system 2400 in accordance with embodiments of the inventive concepts may include a microprocessor 2414, a memory 2412, and a user interface 2418 configured to perform data communication using a bus 2420. The microprocessor 2414 may include a CPU or an AP. The electronic system 2400 may further include a RAM 2416 configured to directly communicate with the microprocessor 2414. The microprocessor 2414 and/or the RAM 2416 may be assembled within a single package. The user interface 2418 may be used to input data to the electronic system 2400, and/or to output data from the electronic system 2400. For example, the user interface 2418 may include a touch pad, a touch screen, a keyboard, a mouse, a scanner, a voice detector, a cathode ray tube (CRT) monitor, an LCD, an AMOLED, a plasma display pad (PDP), a printer, a lighting, and/or various input/output devices. The memory 2412 may store operational codes of the microprocessor 2414, data processed by the microprocessor 2414, and/or data received from the outside. The memory 2412 may include a memory controller, a hard disk, and/or a solid state drive (SSD). The microprocessor 2414, the RAM 2416, and/or the memory 2412 may include the semiconductor device having interconnection-via patterns formed using an overlay mark in accordance with the various embodiments of the inventive concepts.

Since the overlay mark in accordance with the embodiments of the inventive concepts includes a mirror pattern disposed under a main pattern disposed at lower level, optical contrast of the main pattern can be improved. Therefore, an overlay inspection process can be more easily performed, an inspection time can be reduced, and thus productivity can be improved. In addition, since the overlay mark in accordance with the embodiments of the inventive concepts can be simultaneously formed with a contact pattern using a process of forming the contact pattern, it may not add extra burden and/or costs to the semiconductor device fabrication process.

Although example embodiments have been described, those skilled in the art will readily appreciate that many modifications are possible in embodiments without materially departing from the novel teachings and advantages. Accordingly, all such modifications are intended to be included within the scope of this inventive concepts as defined in the claims. In the claims, means-plus-function clauses are intended to cover the structures described herein as performing the recited function, and not only structural equivalents but also equivalent structures. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A semiconductor device, comprising:
   gate patterns in a circuit area of a substrate;
   contact patterns between the gate patterns;
   a mirror pattern in a main rule area of the substrate, wherein the main rule area is free of the gate patterns; and
   a main pattern in the main rule area overlapping the mirror pattern in plan view, wherein the main pattern comprises a plurality of parallel slits extending therethrough and arranged within respective boundaries of the mirror pattern in plan view, wherein the mirror pattern comprises:
a mirror silicide layer on the substrate;
a mirror barrier layer on the mirror silicide layer; and
a mirror plate on the mirror barrier layer.

2. The device according to claim 1, wherein the contact patterns comprise:
a contact silicide layer on the substrate;
a contact barrier layer on the contact silicide layer; and
a contact plug on the contact barrier layer,
wherein the mirror plate and the contact plug are coplanar.

3. The device according to claim 2, wherein the mirror silicide layer and the contact silicide layer are directly formed on the substrate, and the mirror silicide layer and the contact silicide layer include the same material.

4. The device according to claim 1, wherein the mirror pattern has a square shape defining the respective boundaries thereof.

5. The device of claim 1, wherein the substrate includes a circuit area comprising the gate patterns and an overlay mark area that is free of the gate patterns, and wherein the overlay mark area comprises the main rule area including the mirror pattern thereon and a vernier rule area that is free of the mirror pattern.

6. A semiconductor device, comprising:
a substrate including a circuit area and an overlay mark area;
conductive gate patterns on the substrate in the circuit area, wherein the overlay mark area is free of the conductive gate patterns;
conductive contact patterns on the substrate between the conductive gate patterns in the circuit area; and
a mirror pattern on the substrate in the overlay mark area, the mirror pattern and the conductive contact patterns comprising a same reflective material,
wherein the overlay mark area comprises a main rule area including the mirror pattern thereon and a vernier rule area that is free of the mirror pattern between the main rule area and the circuit area.

7. The device of claim 6, wherein the mirror pattern and the conductive contact patterns comprise portions of a same layer of the reflective material, and wherein a surface of the mirror pattern is coplanar with respective surfaces of the conductive contact patterns.

8. The device of claim 7, wherein the mirror pattern and the conductive contact patterns respectively comprise a silicide layer, a metal barrier layer, and a metal plate layer comprising one of the portions of the same layer of the reflective material.

9. The device of claim 6, further comprising:
an insulating layer on the conductive gate patterns, the conductive contact patterns therebetween, and the mirror pattern; and
conductive via patterns extending through the insulating layer and aligned with the conductive contact patterns in the circuit area, respectively, wherein the conductive via patterns provide electrical connections to the conductive contact patterns.

10. The device of claim 9, wherein the conductive via patterns comprise first conductive via patterns, and further comprising:
second conductive via patterns extending through the insulating layer and aligned with the conductive gate patterns in the circuit area, respectively, wherein the second conductive via patterns provide electrical connections to the conductive gate patterns.

11. The device of claim 9, wherein the conductive gate patterns extend in a first direction that is substantially perpendicular to a second direction in which the mirror pattern extends.

12. The device of claim 6, further comprising:
an overlay mark on the substrate in the overlay mark area, the overlay mark comprising the mirror pattern, a main pattern, and a vernier pattern on respective different levels, wherein the main pattern comprises a plurality of elongated slits extending through the main pattern, and wherein the main pattern overlaps the mirror pattern in plan view.

13. The device of claim 12, wherein the overlay mark area comprises the main rule area including the mirror pattern and the main pattern stacked thereon, and the vernier rule area including the vernier pattern thereon, wherein the vernier pattern comprises a plurality of elongated slits extending through the vernier pattern, and wherein the vernier pattern does not overlap the main pattern in plan view.

14. A semiconductor device, comprising:
a substrate including a circuit area and an overlay mark area;
conductive gate patterns on the substrate in the circuit area, wherein the overlay mark area is free of the conductive gate patterns;
conductive contact patterns on the substrate between the conductive gate patterns in the circuit area;
a mirror pattern on the substrate in the overlay mark area, the mirror pattern and the conductive contact patterns comprising a same reflective material; and
an overlay mark on the substrate in the overlay mark area, the overlay mark comprising the mirror pattern, a main pattern, and a vernier pattern on respective different levels, wherein the main pattern comprises a plurality of elongated slits extending through the main pattern, and wherein the main pattern overlaps the mirror pattern in plan view.

15. The device of claim 14, wherein the overlay mark area comprises a main rule area including the mirror pattern and the main pattern stacked thereon, and a vernier rule area including the vernier pattern thereon, wherein the vernier pattern comprises a plurality of elongated slits extending through the vernier pattern, and wherein the vernier pattern does not overlap the main pattern in plan view.

16. The device of claim 14, further comprising:
an insulating layer on the conductive gate patterns, the conductive contact patterns therebetween, and the mirror pattern; and
conductive via patterns extending through the insulating layer and aligned with the conductive contact patterns in the circuit area, respectively, wherein the conductive via patterns provide electrical connections to the conductive contact patterns.

17. The device of claim 16, wherein the conductive via patterns comprise first conductive via patterns, and further comprising:
second conductive via patterns extending through the insulating layer and aligned with the conductive gate patterns in the circuit area, respectively, wherein the second conductive via patterns provide electrical connections to the conductive gate patterns.

18. The device of claim 16, wherein the conductive gate patterns extend in first a direction that is substantially perpendicular to a second direction in which the mirror pattern extends.

19. The device of claim 14, wherein the overlay mark area comprises a main rule area including the mirror pattern thereon and a vernier rule area that is free of the mirror pattern.

20. The device according to claim 14, wherein the mirror pattern has a square shape defining respective boundaries thereof, and wherein the main pattern is arranged within the respective boundaries of the mirror pattern in plan view.

* * * * *